United States Patent
Yamashita

(10) Patent No.: US 10,840,278 B2
(45) Date of Patent: Nov. 17, 2020

(54) SOLID-STATE IMAGE PICKUP DEVICE AND ELECTRONIC APPARATUS

(71) Applicant: SONY SEMICONDUCTOR SOLUTIONS CORPORATION, Kanagawa (JP)

(72) Inventor: Kazuyoshi Yamashita, Kanagawa (JP)

(73) Assignee: Sony Semiconductor Solutions Corporation, Tokyo (JP)

( * ) Notice: Subject to any disclaimer, the term of this patent is extended or adjusted under 35 U.S.C. 154(b) by 0 days.

(21) Appl. No.: 16/485,234

(22) PCT Filed: Feb. 8, 2018

(86) PCT No.: PCT/JP2018/004289
§ 371 (c)(1),
(2) Date: Aug. 12, 2019

(87) PCT Pub. No.: WO2018/155197
PCT Pub. Date: Aug. 30, 2018

(65) Prior Publication Data
US 2019/0371841 A1    Dec. 5, 2019

(30) Foreign Application Priority Data

Feb. 22, 2017    (JP) ................. 2017-030743

(51) Int. Cl.
*H04N 5/378*    (2011.01)
*H04N 5/369*    (2011.01)
*H01L 27/146*   (2006.01)

(52) U.S. Cl.
CPC .. *H01L 27/14603* (2013.01); *H01L 27/14609* (2013.01); *H01L 27/14634* (2013.01); *H01L 27/14641* (2013.01)

(58) Field of Classification Search
CPC ........ H04N 5/369; H04N 5/378; H04N 5/379; H01L 21/02496; H01L 21/02505; H01L 2224/06517
(Continued)

(56) References Cited

U.S. PATENT DOCUMENTS

| 8,514,308 B2* | 8/2013 | Itonaga ................. H04N 5/335 348/308 |
| 8,817,152 B2* | 8/2014 | Abe ...................... H04N 5/335 348/308 |

(Continued)

FOREIGN PATENT DOCUMENTS

| EP | 2315435 | 4/2011 |
| EP | 2800136 | 11/2011 |
| JP | 2013-055589 | 3/2013 |

OTHER PUBLICATIONS

International Search Report and Written Opinion prepared by the European Patent Office dated Apr. 26, 2018, for International Application No. PCT/JP2018/004289.

*Primary Examiner* — Marly S Camargo
(74) *Attorney, Agent, or Firm* — Sheridan Ross P.C.

(57) ABSTRACT

An imaging device includes a pixel array including a plurality of pixel units in a matrix arrangement. At least a first pixel unit of the plurality of pixel units includes a substrate including a first photoelectric conversion region and a second photoelectric conversion region, and a first layer over the substrate and including a first pixel circuit and a second pixel circuit. The first pixel unit includes a second layer over the first layer and including first and second wirings extending in a first direction, and a third layer over the second layer and including signal lines that extend in the second direction. The first pixel unit includes a first via that couples a first signal line to the first wiring, and a second via (Continued)

offset from the first via in the first direction and that couples a second signal line to the second wiring.

20 Claims, 19 Drawing Sheets

(58) Field of Classification Search
USPC .... 348/308, 294, 297, 300, 301, 302, 222.1;
257/291, 292, 293, 159, 278, 210;
250/208.1, 214 A, 214 LA
See application file for complete search history.

(56) References Cited

U.S. PATENT DOCUMENTS

| | | | | |
|---|---|---|---|---|
| 10,659,716 B2* | 5/2020 | Niwa | ...................... | H04N 5/378 348/280 |
| 2009/0295979 A1* | 12/2009 | Matsuo | .................. | H04N 5/335 348/294 |
| 2010/0177226 A1 | 7/2010 | Itonaga et al. | | |
| 2011/0080493 A1 | 4/2011 | Kono et al. | | |
| 2011/0157445 A1* | 6/2011 | Itonaga | .................. | H04N 5/335 348/308 |
| 2013/0002915 A1 | 1/2013 | Itonaga et al. | | |
| 2014/0160334 A1* | 6/2014 | Wakabayashi | ....... | H04N 5/3745 348/302 |
| 2014/0184864 A1 | 7/2014 | Itonaga et al. | | |
| 2014/0267858 A1 | 9/2014 | Ohtsuki et al. | | |
| 2014/0319321 A1* | 10/2014 | Wada | ..................... | H01L 27/146 250/208.1 |
| 2014/0320690 A1* | 10/2014 | Kobayashi | ......... | H04N 5/23212 348/308 |
| 2015/0092094 A1 | 4/2015 | Itonaga et al. | | |
| 2015/0372043 A1* | 12/2015 | Sano | ..................... | H01L 12/146 348/294 |
| 2016/0006970 A1 | 1/2016 | Itonaga et al. | | |
| 2016/0204160 A1 | 7/2016 | Itonaga et al. | | |
| 2016/0336364 A1 | 11/2016 | Itonaga et al. | | |
| 2017/0201705 A1* | 7/2017 | Ishiwata | ............ | H04N 5/37457 348/300 |
| 2017/0338259 A1 | 11/2017 | Itonaga et al. | | |
| 2018/0069040 A1* | 3/2018 | Ohtsuki | ................ | H01L 27/146 250/208.1 |

* cited by examiner

F I G . 1 5
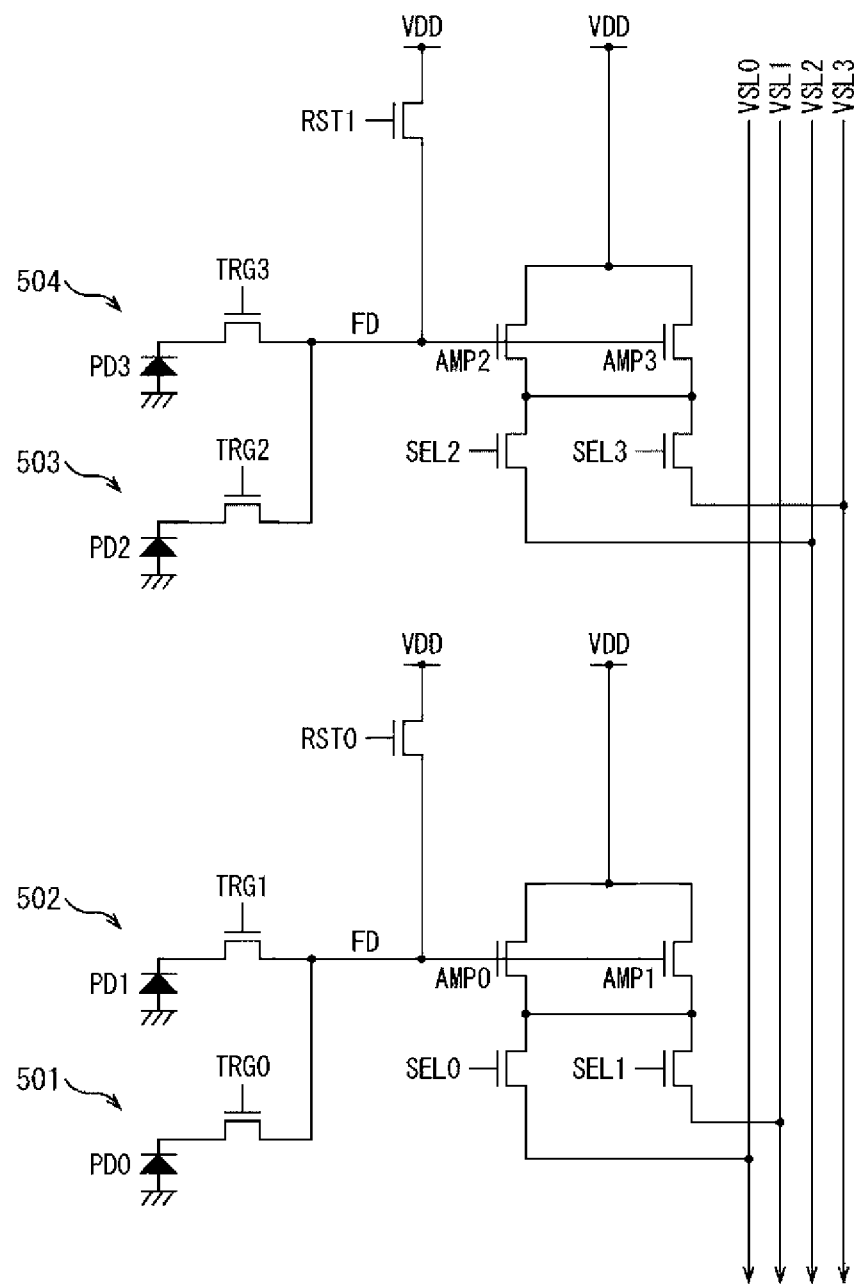

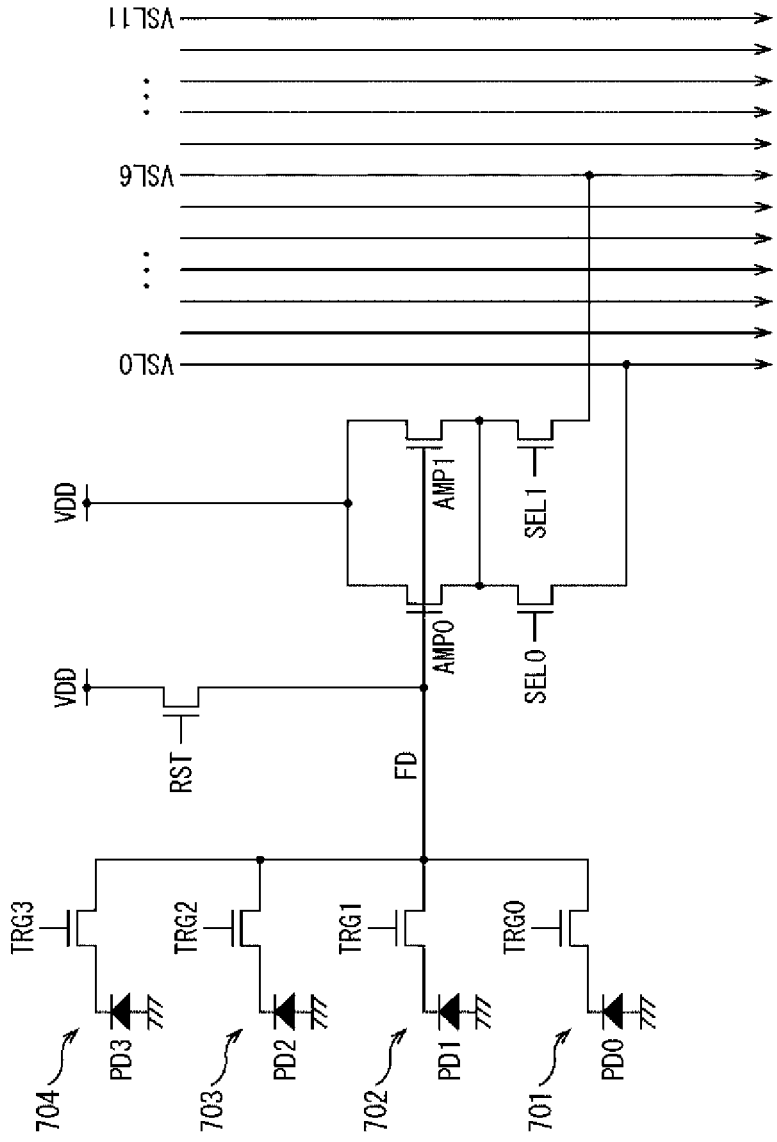
F I G . 1 8

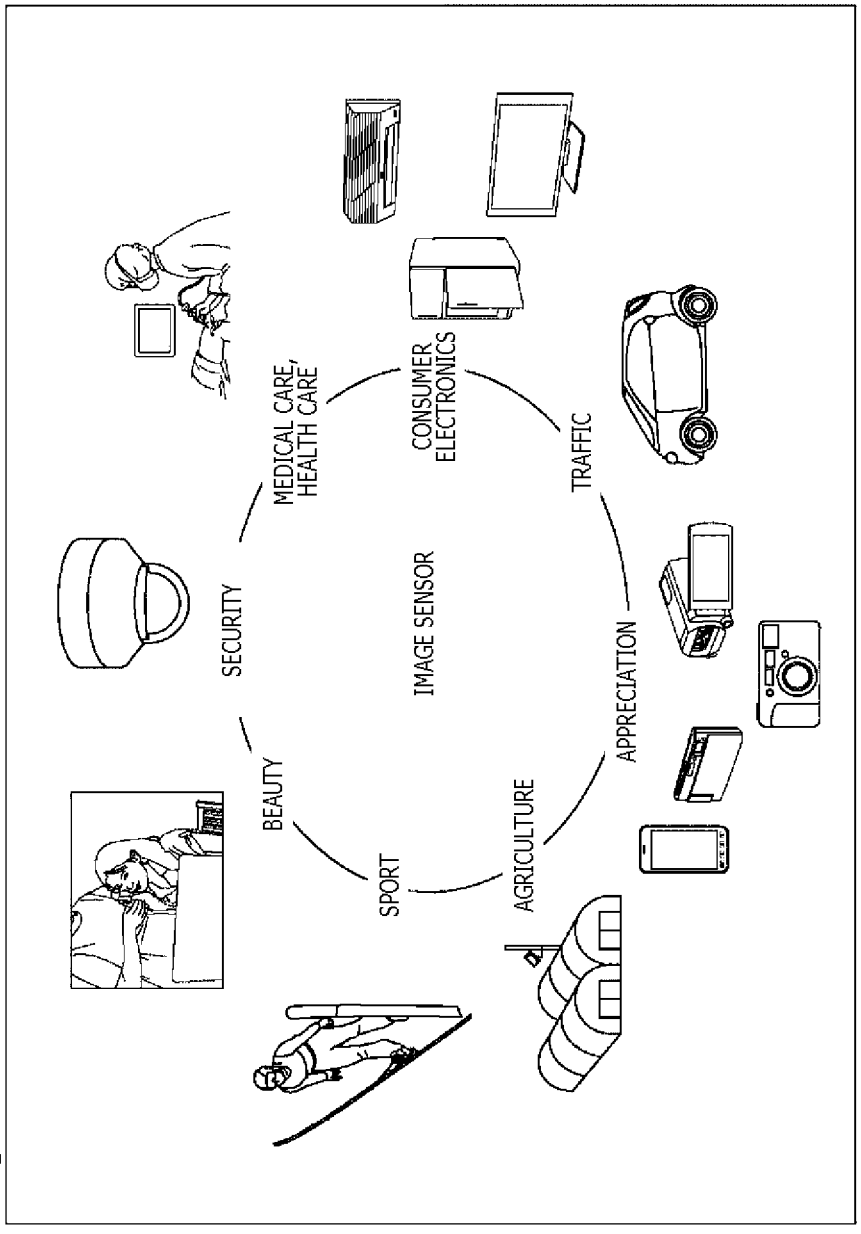

SOLID-STATE IMAGE PICKUP DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/004289 having an international filing date of 8 Feb. 2018, which designated the United States, which PCT application claimed the benefit of Japanese Patent Application No. 2017-030743 filed 22 Feb. 2017, the entire disclosures of each of which are incorporated herein by reference.

TECHNICAL FIELD

The present technique relates to a solid-state image pickup device and an electronic apparatus, and more particularly to a solid-state image pickup device and an electronic apparatus each of which can stabilize a parasitic capacity of a vertical signal line.

BACKGROUND ART

For example, PTL 1 discloses providing a plurality of vertical signal lines every pixel column as a technique for realizing high-speed readout in a solid-state image pickup device.

CITATION LIST

Patent Literature

PTL 1: JP 2013-55589A

SUMMARY OF INVENTION

Technical Problem

Incidentally, in such a configuration as to be disclosed in PTL 1, it was feared that a parasitic capacity between the vertical signal lines becomes a primary factor for hindering promotion of a high-frame rate.

The present technique has been made in the light of such circumstances, and aims at stabilizing a parasitic capacity of the vertical signal line.

Solution to Problem

An imaging device of the present technique includes a pixel array including a plurality of pixel units in a matrix arrangement.

At least a first pixel unit of the plurality of pixel units includes a substrate including a first photoelectric conversion region and a second photoelectric conversion region.

The first pixel unit includes a first layer over the substrate and including a first pixel circuit coupled to the first photoelectric conversion region and a second pixel circuit coupled to the second photoelectric conversion region.

The first pixel circuit has one or more first transfer elements to output a first pixel signal, and the second pixel circuit has one or more second transfer elements to output a second pixel signal.

The first pixel unit includes a second layer over the first layer and the second layer includes first and second wirings extending in a first direction.

The first wiring is spaced apart from the second wiring in a second direction that is perpendicular to the first direction, and the first wiring is coupled to the one or more first transfer elements.

The second wiring is coupled to the one or more second transfer elements.

The first pixel unit includes a third layer over the second layer and the third layer includes signal lines that extend in the second direction.

The first pixel unit includes a first via that couples a first signal line of the signal lines to the first wiring.

The first pixel unit includes a second via offset from the first via in the first direction and that couples a second signal line of the signal lines to the second wiring.

An imaging device of the present technique includes a pixel array including a plurality of pixel units in a matrix arrangement. A pixel unit of the plurality of pixel units includes: a substrate including a plurality of photoelectric conversion regions, the plurality of photoelectric conversion regions sharing a floating diffusion; a first layer over the substrate and including a pixel circuit coupled to the plurality of photoelectric conversion regions, the pixel circuit having one or more transfer elements to output a pixel signal; a second layer over the first layer and including first and second wirings extending in a first direction, the first wiring being offset from the second wiring in the first direction, the first wiring being spaced apart from the second wiring in a second direction that is perpendicular to the first direction, the first and second wirings being coupled to the pone or more transfer elements; a third layer over the second layer and including signal lines that extend in the second direction; a first via that couples a first signal line of the signal lines to the first wiring; and a second via offset from the first via in the first direction and that couples a second signal line of the signal lines to the second wiring.

According to the present technique, an electronic apparatus comprises an imaging device including a pixel array including a plurality of pixel units in a matrix arrangement. A first pixel unit of the plurality of pixel units includes a substrate including a first photoelectric conversion region and a second photoelectric conversion region; a first layer over the substrate and including a first pixel circuit coupled to the first photoelectric conversion region and a second pixel circuit coupled to the second photoelectric conversion region, the first pixel circuit having one or more first transfer elements to output a first pixel signal, the second pixel circuit having one or more second transfer elements to output a second pixel signal; a second layer over the first layer and including first and second wirings extending in a first direction, the first wiring being spaced apart from the second wiring in a second direction that is perpendicular to the first direction, the first wiring being coupled to the one or more first transfer elements, the second wiring being coupled to the one or more second transfer elements; a third layer over the second layer and including signal lines that extend in the second direction; a first via that couples a first signal line of the signal lines to the first wiring; and a second via offset from the first via in the first direction and that couples a second signal line of the signal lines to the second wiring.

Advantageous Effects of Invention

According to the present technique, it becomes possible to stabilize the parasitic capacity of the vertical signal line. It should be noted that the effect described herein is not

BRIEF DESCRIPTION OF DRAWINGS

FIG. 15 is a circuit diagram depicting an example of a configuration of a pixel and vertical signal lines of a third embodiment.

FIG. 18 is a circuit diagram depicting an example of a configuration of a pixel and vertical signal lines of a fifth embodiment.

FIG. 21 is a view depicting an example of use of an image sensor.

DESCRIPTION OF EMBODIMENTS

Hereinafter, modes for carrying out the present disclosure (hereinafter, referred to as embodiments) will be described. It should be noted that the description will be given in the following order.

1. Example of configuration of solid-state image pickup device
2. First Embodiment
3. Second Embodiment
4. Third Embodiment
5. Fourth Embodiment
6. Fifth Embodiment
7. Example of configuration of electronic apparatus
8. Examples of use of image sensor

1. Example of Configuration of Solid-State Image Pickup Device

Figure 1:
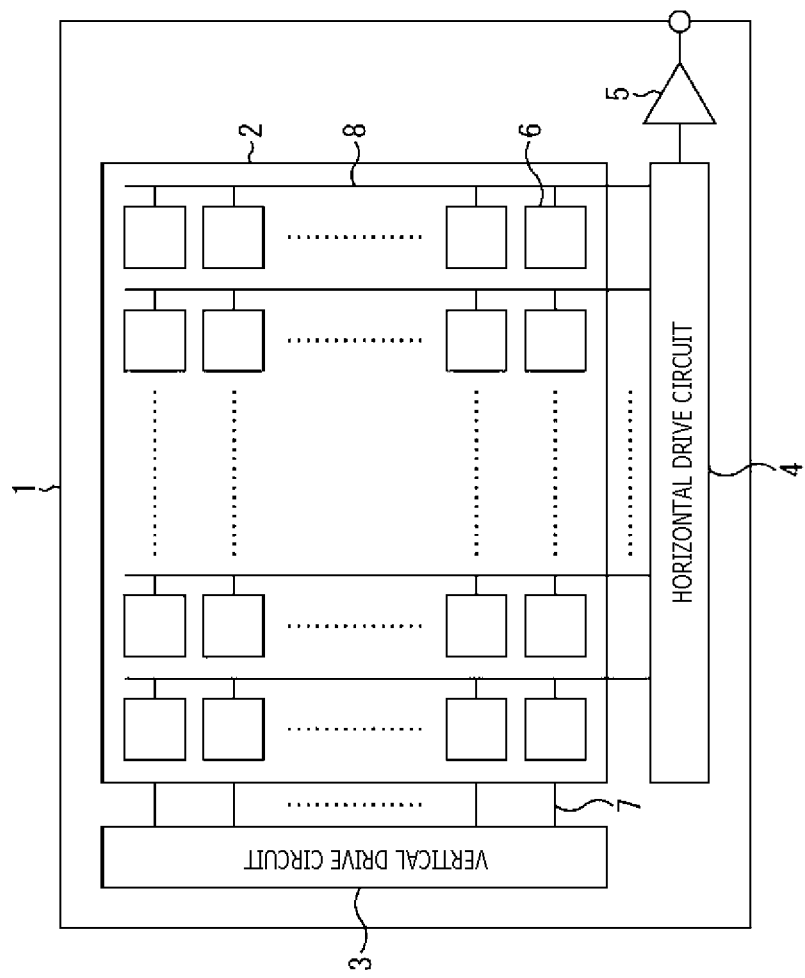
FIG. 1 is a block diagram depicting an example of a configuration of a solid-state image pickup device.

FIG. 1 is a block diagram depicting an example of a configuration of an embodiment of a solid-state image pickup device to which the present technique is applied. The solid-state image pickup device of FIG. 1, for example, is configured in the form of a CMOS (Complementary Metal Oxide Semiconductor) image sensor.

A solid-state image pickup device 1 of FIG. 1 is provided with a pixel array 2, a vertical drive circuit 3, a horizontal drive circuit 4, and an output circuit 5.

In the pixel array 2, a plurality of pixels 6 are arranged in matrix. The respective pixels 6 are connected to the vertical drive circuit 3 every row by a horizontal signal line 7, and are connected to the horizontal drive circuit 4 every column by a vertical signal line 8.

The vertical drive circuit 3 outputs a drive signal through the horizontal signal lines 7 to drive the pixels 6, every row, arranged in the pixel array 2.

The horizontal drive circuit 4 executes column processing for detecting signal levels by a CDS (Correlated Double Sampling) operation from pixel signals output from the respective pixels 6 of the pixel array 2 through the vertical signal lines 8. The horizontal drive circuit 4 outputs output signals corresponding to electric charges generated through photoelectric conversion in the pixels 6 to the output circuit 5.

The output circuit 5 amplifies the output signals which are successively output from the horizontal drive circuit 4 to voltage values at predetermined levels, and outputs the resulting output signals to an image processing circuit and the like in the subsequent stage thereof.

Figure 2:
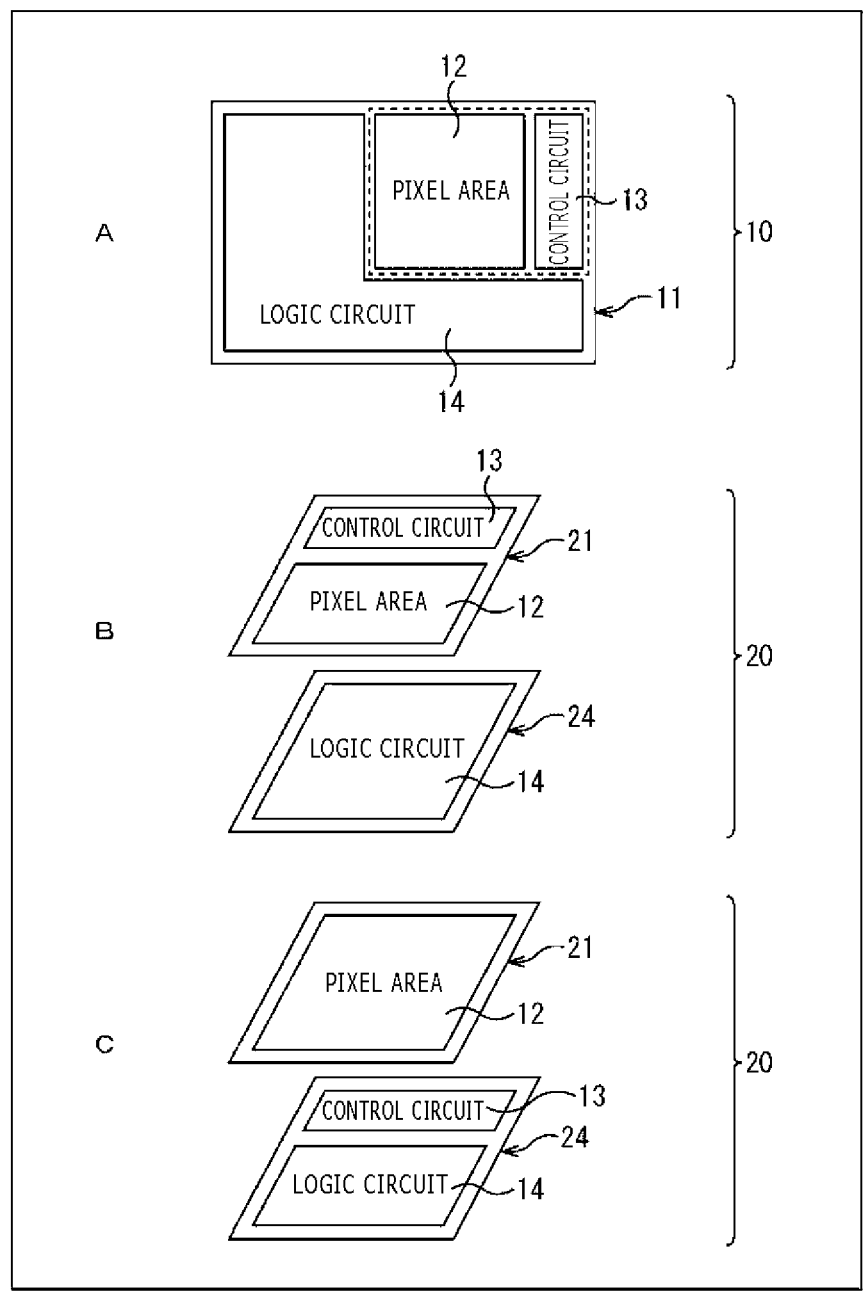
FIG. 2 is a view depicting outlines of examples of a configuration of a solid-state image pickup device to which the present technique can be applied.

FIGS. 2A-2C are views depicting outlines of examples of a configuration of a solid-state image pickup device to which the present technique can be applied.

FIG. 2A depicts a schematic configuration example of a non-laminated type solid-state image pickup device. As depicted in FIG. 2A, a solid-state image pickup device 10 has one sheet of die (semiconductor substrate) 11. The die 11 is equipped with a pixel area 12, a control circuit 13, and a logic circuit 14. The pixels are arranged in array in the pixel area 12. The control circuit 13 carries out the various control for drive of the pixels, and others. The logic circuit 14 includes a signal processing circuit for executing the signal processing.

FIGS. 2B and 2C depict a schematic configuration example of a laminated solid-state image pickup device. In a solid-state image pickup device 20, as depicted in FIGS. 2B and 2C, two sheets of dies: a sensor die 21; and a logic die 24 are laminated on each other, and electrically connected to each other be configured in the form of one semiconductor chip.

In FIG. 2B, the sensor die 21 is equipped with the pixel area 12 and the control circuit 13, and the logic die 24 is equipped with the logic circuit 14.

In FIG. 2C, the sensor die 21 is equipped with the pixel area 12, and the logic die 24 is equipped with the control circuit 13 and the logic circuit 14.

Figure 3:
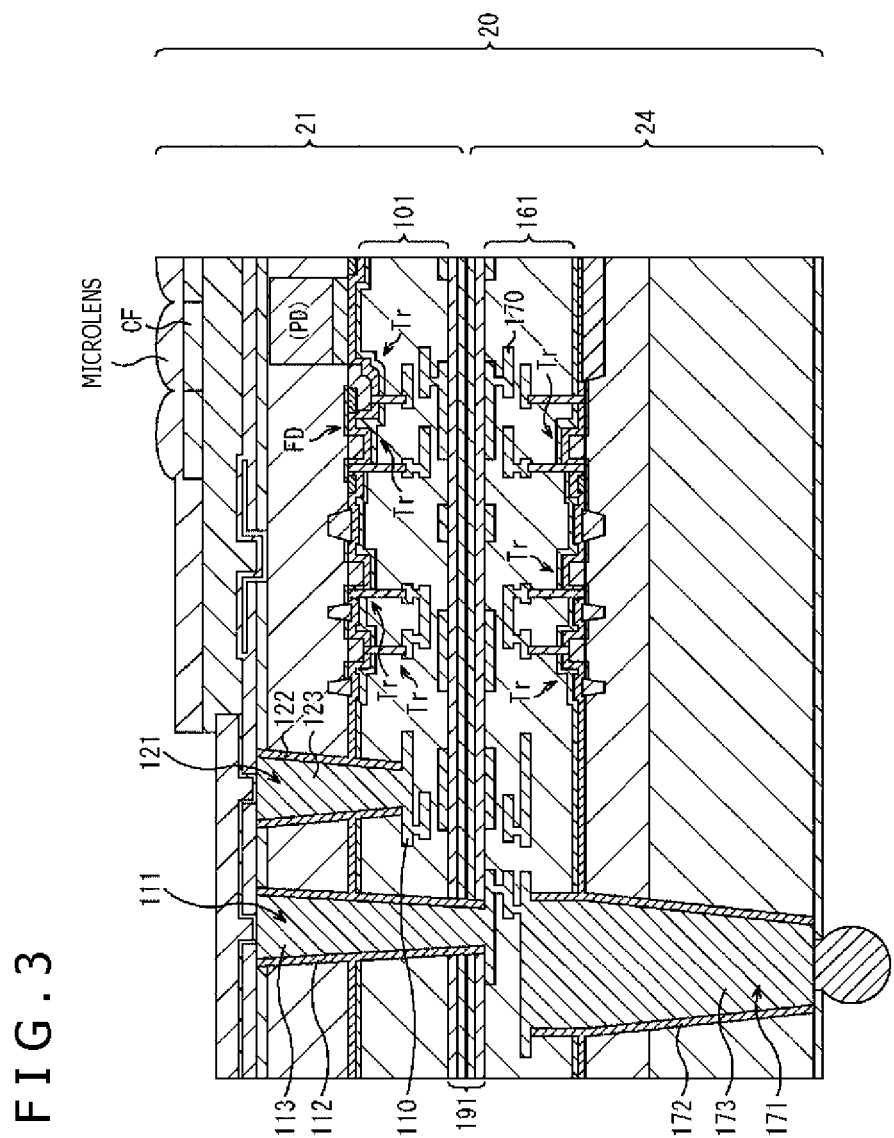
FIG. 3 is a cross-sectional view depicting a first structural example of a laminated solid-state image pickup device.

FIG. 3 is a cross-sectional view depicting a first configuration example of the laminated solid-state image pickup device 20.

A PD (photodiode), an FD (Floating Diffusion), and a Tr (MOS FET) constituting the pixel becoming the pixel area 12, Tr becoming the control circuit 13, and the like are formed on the sensor die 21. Moreover, a wiring layer 101 having wirings 110 of a plurality of layers (three layers in this example) is formed on the sensor die 21. It should be noted that (Tr becoming) the control circuit 13 can also be configured in the logic die 24 instead of being configured in the sensor die 21.

Tr constituting the logic circuit 14 is formed in the logic die 24. Moreover, a wiring layer 161 having a wiring 170 of a plurality of layers (three layers in this example) is formed in the logic die 24. In addition, a connection hole 171 in which an insulating film 172 is formed on an inner wall surface thereof is formed in the logic die 24. A connection conductor 173 connected to the wiring 170, and the like is filled in the connection hole 171.

The sensor die 21 and the logic die 24 are stuck to each other in such a way that their wiring layers 101 and 161 face each other. As a result, the solid-state image pickup device 20 is structured in which the sensor die 21 and the logic die 24 are laminated on each other. A film 191 such as a protective film is formed on a surface through which the sensor die 21 and the logic die 24 are stuck to each other.

A connection hole 111 which completely extends through the sensor die 21 from a back surface side (a side of incidence of light to the PD, an upper side in the figure) of the sensor die 21 to reach the wiring 170 of the uppermost layer of the logic die 24 is formed in the sensor die 21. Moreover, a connection hole 121 which is closely adjacent to the connection hole 111 to reach the first level wiring 110 from the back surface side of the sensor die 21 is formed in the sensor die 21. An insulating film 112 is formed on an inner wall surface of the connection hole 111, and an insulating film 122 is formed on an inner wall surface of the connection hole 121. In addition, connection conductors 113 and 123 are individually filled in the connection holes 111 and 121. The connection conductor 113 and the connection conductor 123 are electrically connected to each other on the back side surface of the sensor die 121. As a result, the sensor die 21 and the logic die 24 are electrically connected to each other through the wiring layer 101, the connection hole 121, the connection hole 111, and the wiring layer 161.

Figure 4:
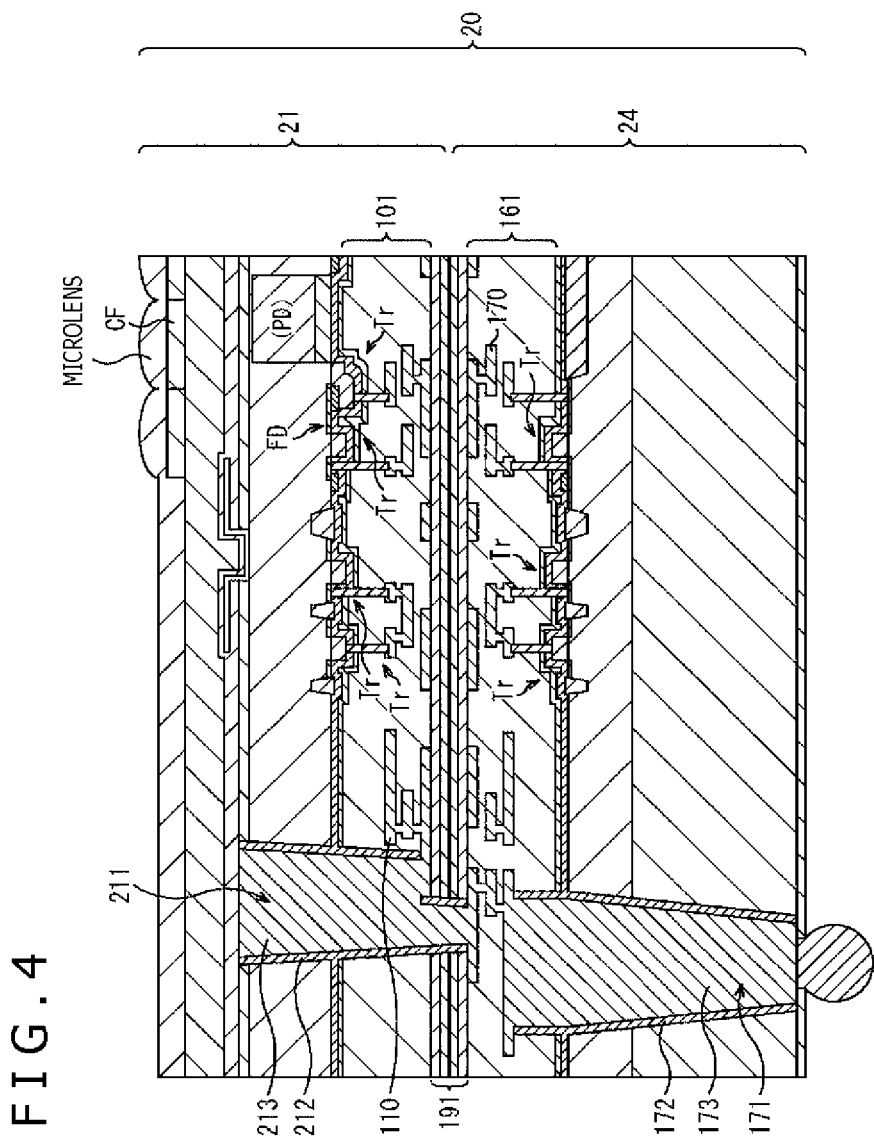
FIG. 4 is a cross-sectional view depicting a second structural example of the laminated solid-state image pickup device.

FIG. 4 is a cross-sectional view depicting a second configuration example of the laminated solid-state image pickup device 20.

In the second configuration example of the solid-state image pickup device 20, the sensor die 21 and the logic die 24 are electrically connected to each other through one connection hole 211 formed in the sensor die 21.

That is to say, in FIG. 4, the connection hole 211 is formed so as to completely extend through the sensor die 21 from the back surface side of the sensor die 21 to reach the wiring 170 of the uppermost layer of the logic die 24, and reach the wiring 110 of the uppermost layer of the sensor die 21. An insulating film 212 is formed on an inner wall surface of the connection hole 211, and a connection conductor 213 is filled in the connection hole 211. In FIG. 3, the sensor die 21 and the logic die 24 are electrically connected to each other through the two connection holes 111 and 121. In FIG. 4, however, the sensor die 21 and the logic die 24 are electrically connected to each other through the one connection hole 211.

Figure 5:
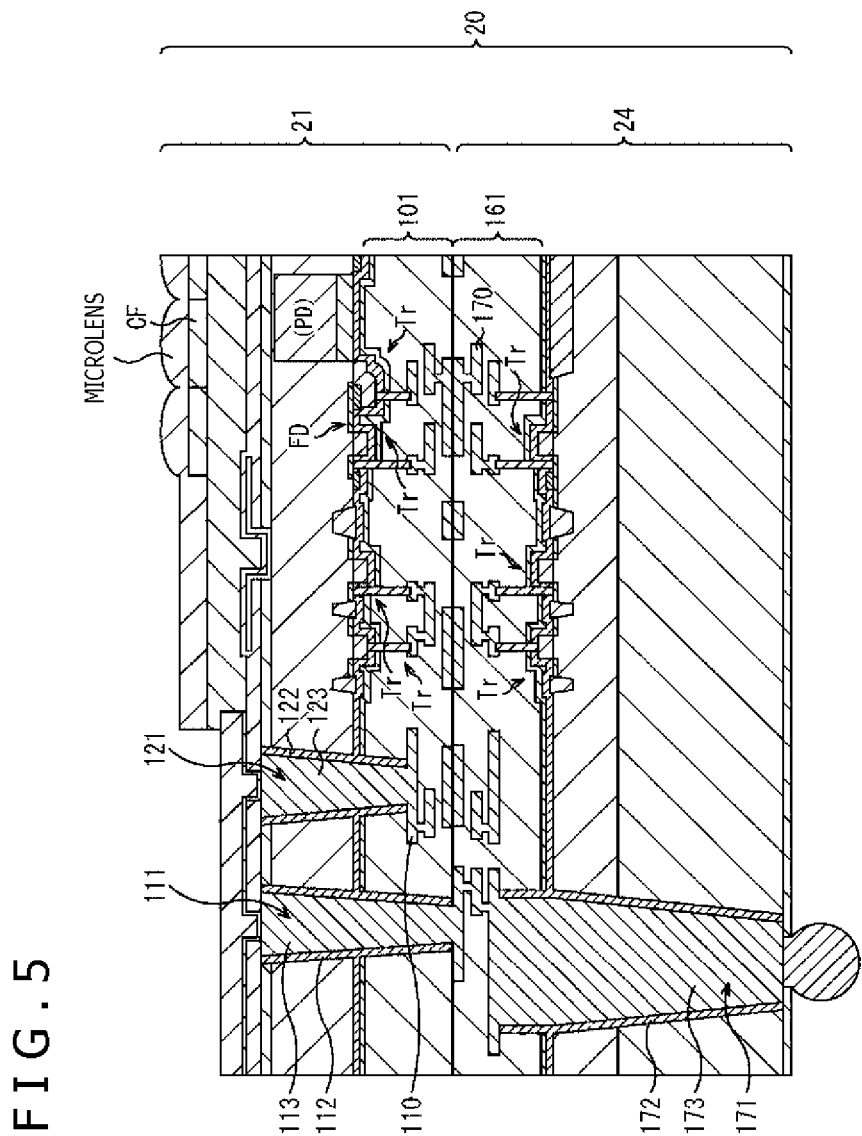
FIG. 5 is a cross-sectional view depicting a third structural example of the laminated solid-state image pickup device.

FIG. 5 is a cross-sectional view depicting a third configuration example of the laminated solid-state image pickup device 20.

The solid-state image pickup device 20 of FIG. 5 is different from the solid-state image pickup device 20 of FIG. 3 in that the film 191 such as the protective film is not formed on the surface through which the sensor die 21 and the logic die 24 are stuck to each other.

The solid-state image pickup device 20 of FIG. 5 is configured in such a way that the sensor die 21 and the logic die 24 are stacked on each other so that the wiring 110 and the wiring 170 directly contact each other, and the wiring 110 and the wiring 170 are directly joined to each other by heating the sensor die 21 and the logic die 24 while a necessary load is applied thereto.

Here, a description will be given with respect to a concrete configuration of the laminated solid-state image pickup device 20 to which the present technique is applied with reference to FIG. 6.

Figure 6:
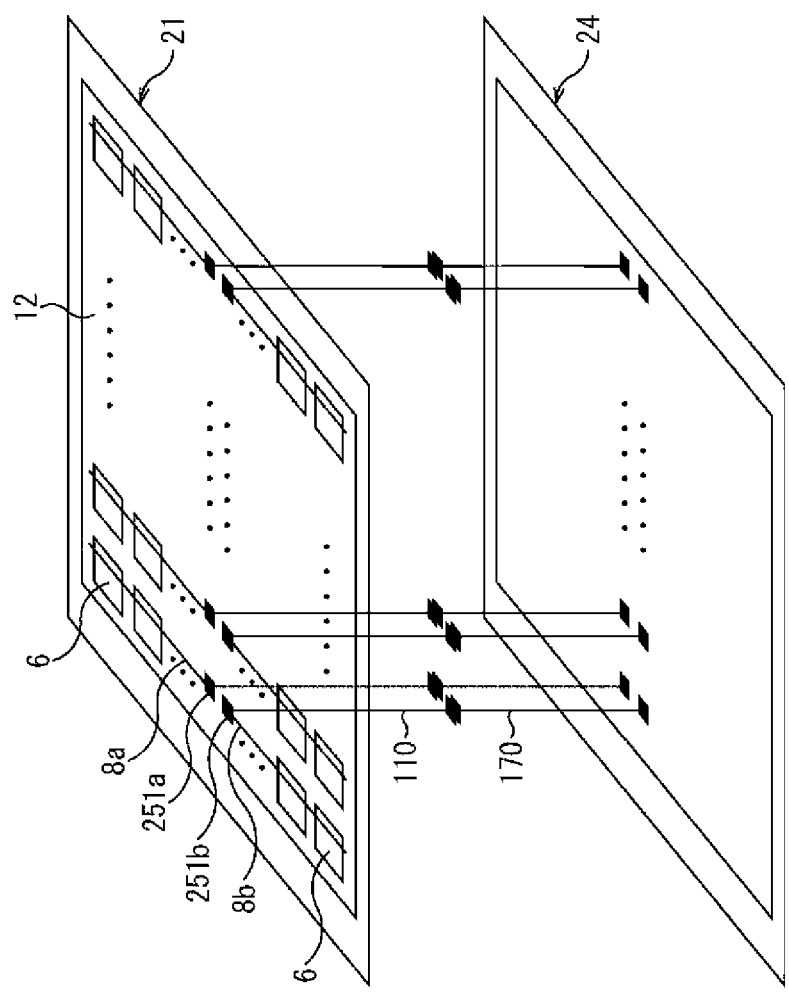
FIG. 6 is a view depicting an example of a concrete configuration of a solid-state image pickup device to which the present technique is applied.

The solid-state image pickup device 20 of FIG. 6 adopts similar configuration to that of the solid-state image pickup device 20 of FIG. 5, and is configured in such a way that the sensor die 21 and the logic die 24 are stacked on each other so as to directly join the wiring 110 and the wiring 170.

In the example of FIG. 6, the pixels 6 provided in the pixel area 12 of the sensor die 21 are arranged so as to be partitioned into an upper side and a lower side of the pixel area 12.

Pixel signals of the pixels 6 provided in the upper side area of the pixel area 12 are output to a vertical signal line 8a. The vertical signal line 8a is connected to an electrode 251a formed at an end portion on a lower side thereof. That is to say, the pixel signals of the pixels 6 provided in the upper side area of the pixel area 12 are output to an AD conversion circuit provided in the logic die 24 through the vertical signal line 8a, the electrode 251a, and the wirings 110 and 170.

Pixel signals of the pixels 6 provided in the lower side area of the pixel area 12 are output to a vertical signal line 8b. The vertical signal line 8b is connected to an electrode 251b formed at an end portion on an upper side thereof. That is to say, the pixel signals of the pixels 6 provided in the lower side area of the pixel area 12 are output to the AD conversion circuit provided in the logic die 24 through the vertical signal line 8b, the electrode 251b, and the wirings 110 and 170.

In such a way, the vertical signal lines are separated in a vertical direction (in a column direction), thereby enabling the high-speed readout to be realized. It should be noted that although in the example of FIG. 6, one vertical signal line is provided per one pixel column, a plurality of vertical signal lines are provided per one pixel column, thereby enabling the higher readout to be realized.

Hereinafter, a description will be given with respect to embodiments of the solid-state image pickup device to which the present technique is applied.

2. First Embodiment

Figure 7:
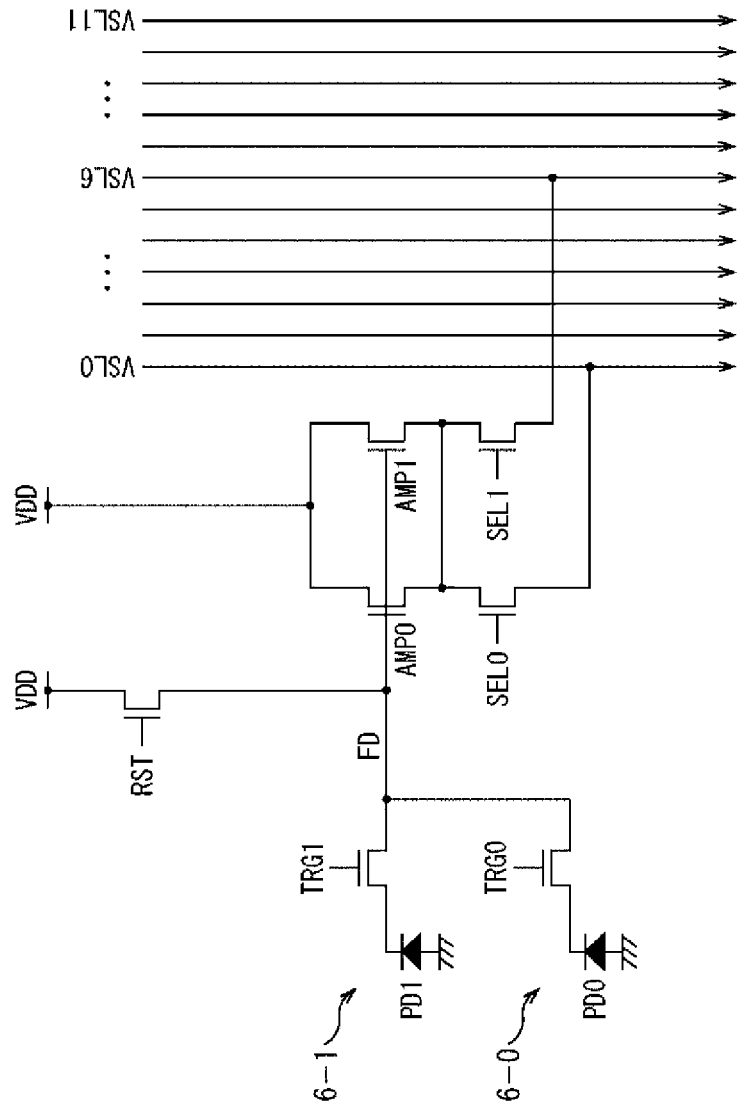
FIG. 7 is a circuit diagram depicting an example of a configuration of a pixel and vertical signal lines of a first embodiment.

FIG. 7 is a circuit diagram depicting an example of a configuration of a pixel and vertical signal lines of a first embodiment.

The present embodiment adopts a configuration of longitudinal two pixel sharing in which two pixels 6-0 and 6-1 longitudinally arranged in one pixel column hold one FD in common. In addition, in the present embodiment, 12 vertical signal lines VSL0 to VSL11 are provided per one pixel column.

The pixel 6-0 has a PD0 and a transfer transistor TRG0, and the pixel 6-1 has a PD1 and a transfer transistor TRG1. A connection point between the transfer transistors TRG0 and TRG1 constitutes the FD.

The transfer transistor TRG0 is driven in accordance with a transfer signal supplied from the vertical drive circuit 3 (FIG. 1) through the horizontal signal line 7, and is turned ON at a timing at which the transfer signal becomes High level in a pulse like shape. When the transfer transistor TRG0 is turned ON, the electric charges generated in PD0 are transferred to the FD through the transfer transistor TRG0.

The transfer transistor TRG1 is driven in accordance with a transfer signal supplied from the vertical drive circuit 3 through the horizontal signal line 7, and is turned ON at a timing at which the transfer signal becomes High level in a pulse like shape. When the transfer transistor TRG1 is turned ON, the electric charges generated in PD1 are transferred to the FD through the transfer transistor TRG1.

The FD is connected to each of gate electrodes of amplification transistors AMP0 and AMP1. The respective amplification transistors AMP0 and AMP1 output voltages at levels corresponding to the electric charges accumulated in the FD.

Selection transistors SEL0 and SEL1 are driven in accordance with electric signals supplied from the vertical drive circuit 3 through the respective horizontal signal lines 7, and are turned ON at a timing at which the selection signals become High level in the pulse like shapes. When the selection transistor SEL0 is turned ON, the voltage output from the amplification transistor AMP0 becomes a state in which it can be output to the vertical signal line VSL0 through the selection transistor SEL0. In addition, when the selection transistor SEL1 is turned ON, the voltage output from the amplification transistor AMP1 becomes a state in which it can be output to the vertical signal line VSL6 through the selection transistor SEL1. Throughout the remainder of this description, transistors such as TRG0, TRG1, SEL0, SEL1, AMP0, AMP2, RST, etc. may be referred to as transfer elements.

A reset transistor RST is driven in accordance with a reset signal supplied from the vertical drive circuit 3 through the horizontal signal line and is turned ON at a timing at which the reset signal becomes High level in a pulse like shape. When the reset transistor RST is turned ON, the electric charges accumulated in the FD are discharged at a power source electric potential VDD to reset the FD.

Figure 8:
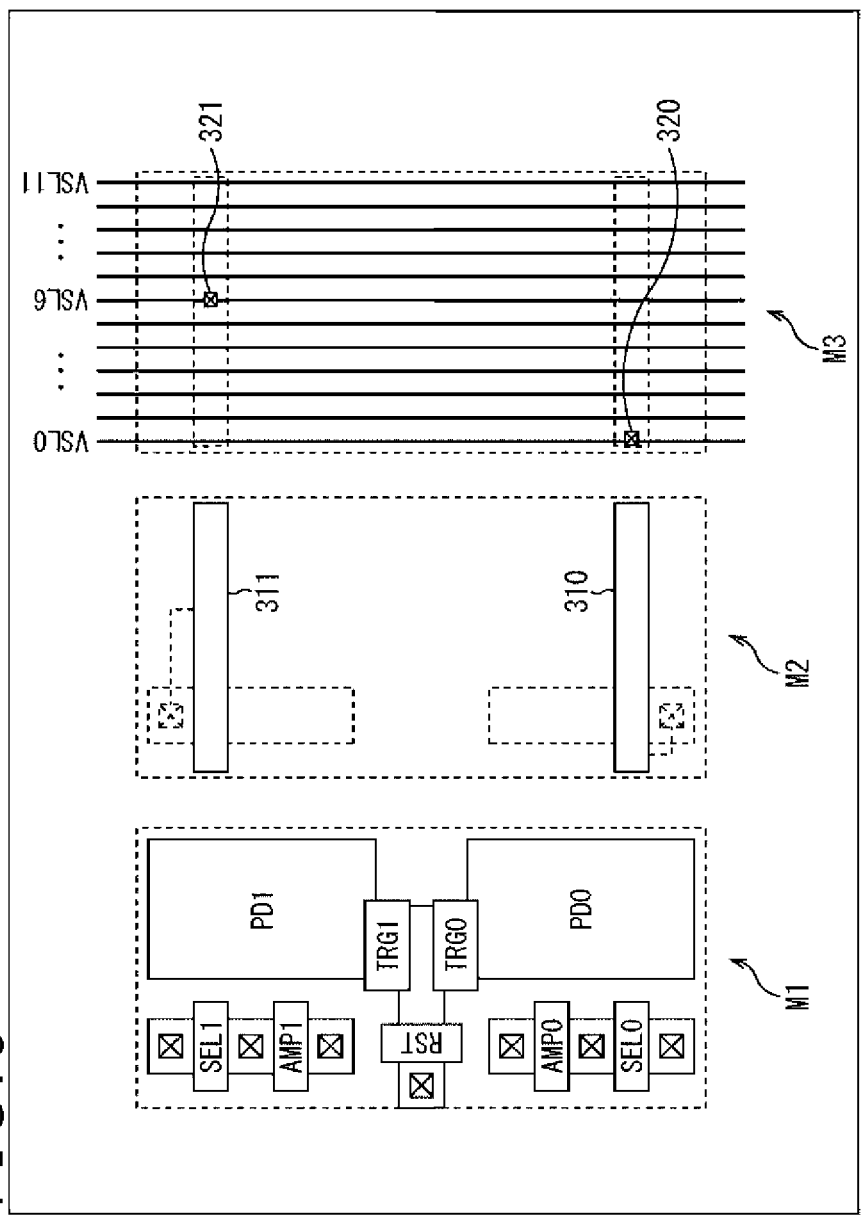
FIG. 8 is a top plan view depicting a layout of each of metal layers.

FIG. 8 is a top plan view depicting an example of a layout of each of metal layers in portions of the pixels 6-0 and 6-1.

As depicted in FIG. 8, the portions of the pixels 6-0 and 6-1 are constituted by metal layers M1 to M3 of three layers.

The PD0 and PD1, and the respective transistors, including the transfer transistors TRG0 and TRG1 are formed in the metal layer M1.

A connection wiring (or first wiring) 310 connected to the selection transistor SEL0 which outputs the pixel signal, and a connection wiring (or second wiring) 311 connected to the selection transistor SEL1 which outputs the pixel signal are formed in the metal layer M2 provided in the upper layer of the metal layer M1. One or more of the selection transistors SEL0/SEL1, the amplification transistors AMP0/AMP1, the reset transistor RST, the transfer transistors TRG0/TRG1, and their associated wirings may be collectively referred to as a pixel circuit. In FIG. 8, PD0 has an associated first pixel circuit (e.g., TRG0, AMP0, SEL0, and RST) and PD1 has an associated second pixel circuit (e.g., TRG1, AMP1, SEL1, and RST). Although not explicitly shown in FIG. 8 PD0 and PD1 may be isolated from one another by an isolation region. Further, a pixel unit may refer to an area occupied by one or more photoelectric conversion regions, any associated pixel circuits, and/or wiring layers. For example, in FIG. 8, a pixel unit includes PD0 and PD1 and the areas outlined as M1, M2, and M3. As another example, in FIG. 19, a pixel unit includes PD0, PD1, PD2, and PD3 and the areas outlined as M1, M2, and M3. Further still, a photoelectric conversion region may refer to the area of a substrate that includes PD0/PD1 (as in FIG. 8) or PD0/PD1/PD2/PD3 (as in FIG. 19).

12 vertical signal lines (or signal lines) VSL0 to VSL11 are formed in the metal layer M3 provided in the upper layer of the metal layer M2. Of them, the vertical signal line VSL0 is connected to the connection wiring 310 of the metal layer M2 through a via 320, and the vertical signal line VSL6 is connected to the connection wiring 311 of the metal layer M2 through a via 321.

That is to say, the pixel signals of the pixels 6-0 and 6-1 are either output to the vertical signal line VSL0 through the connection wiring 310 and the via (or first via) 320 or output to the vertical signal line VSL6 through the connection wiring 311 and the via (or second via) 321. As shown in FIG. 8, the first via 320 couples a first signal line VSL0 to the first wiring 310, and the second via 321 couples a second signal line VSL6 to the second wiring 311. As also shown, the second via 321 is offset from the first via 320 in a first direction, and the second via 321 is spaced apart from the first via 320 in a second direction that is perpendicular to the first direction.

In addition, the connection wirings 310 and 311 are provided every pixel, and are formed in such a way that lengths thereof become lengths orthogonally intersecting all the vertical signal lines VSL0 to VSL11, and become the same length every pixel.

It should be noted that since in the present embodiment, the pixels in one pixel column adopt the configuration of the longitudinal two pixel sharing, the structure depicted in FIG. 8 is repetitively provided in the vertical direction (in the column direction). It is only necessary that in each configuration of the longitudinal two pixel sharing, the connection wirings of the two pixels are connected to the vertical signal lines different from each other. In the example of FIG. 8, the respective connection wirings 310 and 311 of the pixels 6-0 and 6-1 are individually connected to the vertical signal lines VSL0 and VSL6. However, the respective connection wirings 310 and 311 of other two pixels may be individually connected to the vertical signal lines VSL1 and VSL7, or may be individually connected to the vertical signal lines VSL5 and VSL11.

According to such a configuration, the parasitic capacities between the vertical signal lines VSL0 to VSL11, and the connection wirings 310 and 311 of the lower layer thereof can be held equal to each other irrespective of the pixels to be stabilized.

It should be noted that when in the configuration as depicted in FIG. 8, the area of the connection wiring becomes large, the parasitic capacity per one vertical signal line becomes large. In this case, a time constant determined depending on RC becomes large, and a settling time of the pixel signal in the vertical signal line becomes long. It was feared that this situation becomes a factor hindering the promotion of the high-frame rate.

Then, in the below, a description will be given with respect to a configuration in which the area of the connection wiring is reduced.

Figure 9:
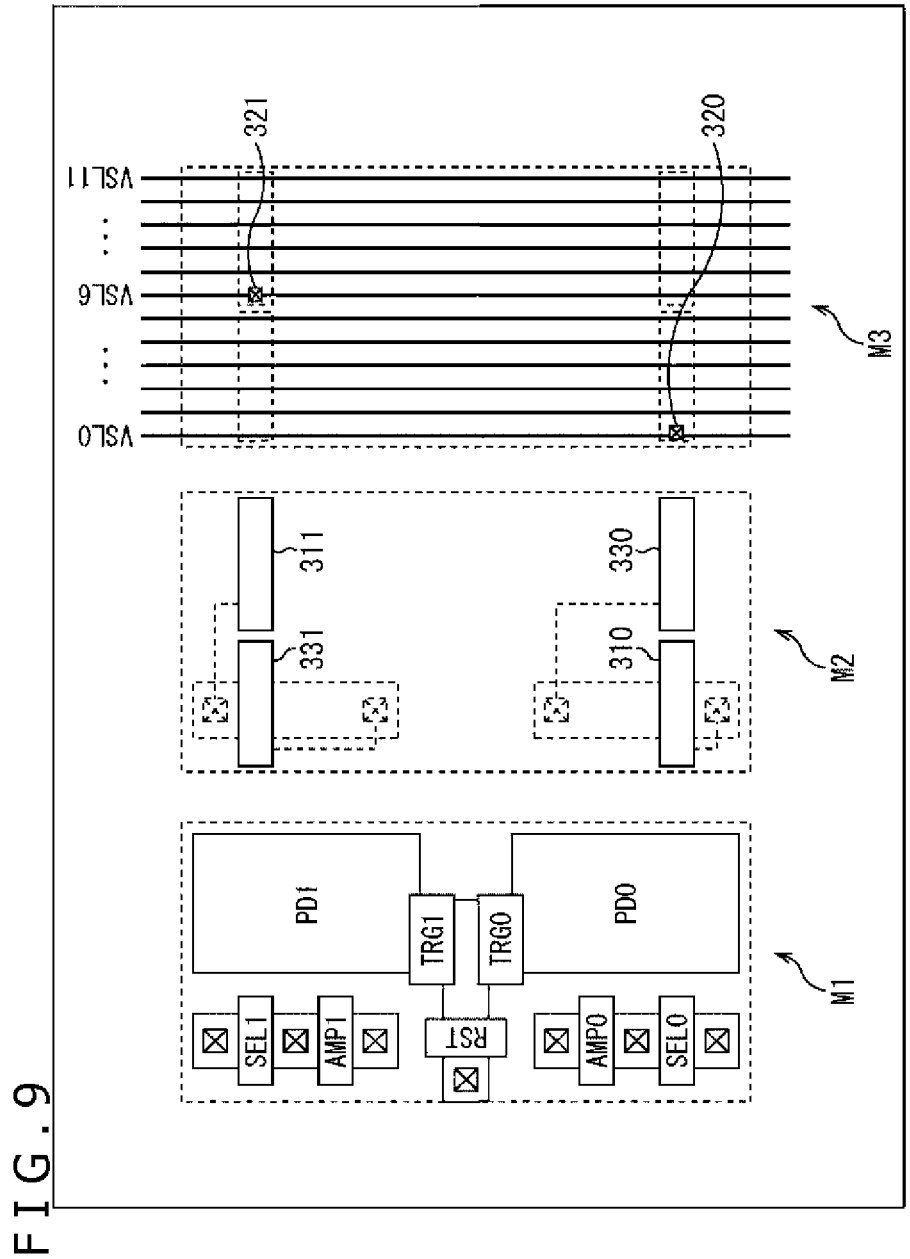
FIG. 9 is a top plan view depicting a layout of each of metal layers.

FIG. 9 is a top plan view depicting another example of a layout of each of metal layers in the portions of the pixels 6-0 and 6-1.

In the example of FIG. 9, the lengths of the connection wirings 310 and 311 formed in the metal layer M2 are approximately halves of the connection wirings 310 and 311 of the example of FIG. 8.

Specifically, the connection wiring 310 is formed so as to have a length and an arrangement orthogonally intersecting the vertical signal lines VSL0 to VSL5. Moreover, a shielding wiring (or dummy electrode or dummy wiring) 330 which extends on the same line as that of the connection wiring 310 and is held at a predetermined fixed electric potential is formed on the right-hand side of the figure of the connection wiring 310. As shown in FIG. 9, the dummy electrode 330 is aligned with the wiring 310 in the first direction, and the dummy electrode 311 is aligned with the wiring 331 in the first direction.

In addition, the connection wiring 311 is formed so as to have a length and an arrangement orthogonally intersecting the vertical signal lines VSL6 to VSL1. Moreover, the shielding wiring (or dummy electrode or dummy wiring) 331 which extends on the same line as that of the connection wiring 311 and is held at a predetermined fixed electric potential is formed on the left-hand side of the figure of the connection wiring 311.

It should be noted that in the example of FIG. 9, the shielding wirings 330 and 331 shall be supposed to be connected to a power source electric potential VDD.

In such a way, the connection wiring and the shielding wiring are provided every pixel, and are formed in such a way that the entire lengths thereof are lengths orthogonally intersecting all the vertical signal lines VSL0 to VSL11, and becomes the same length every pixel. That is to say, in FIG. 9, the entire lengths of the connection wiring 310 and the shielding wiring 330 are set equal to the entire lengths of the connection wiring 311 and the shielding wiring 331.

According to such a configuration, as compared with the configuration of FIG. 8, the area of the connection wirings 310 and 311 is reduced to approximately a half. Therefore, the parasitic capacity between the vertical signal lines VSL0 to VSL11, and the connection wirings 310 and 311 in the lower layer thereof can be suppressed to approximately a half, and thus the high-frame rate can be promoted.

It should be noted that although in the configuration of FIG. 9, the shielding wiring can be omitted, the provision of the shielding wiring results in that the coupling between the vertical signal line and other wirings can be prevented (or reduced), and the effect of suppression of the noise can be enhanced.

Furthermore, the entire lengths of the connection wiring and the shielding wiring which are provided every pixel are made the same length every pixel. As a result, the optical symmetry and the electric symmetry can be held, and the optical characteristics and the electric characteristics of the vertical signal lines can be uniformized.

It should be noted that although in the example of FIG. 9, the shielding wirings 330 and 331 are connected to the power source electric potential VDD, the shielding wirings 330 and 331 may also be connected to a fixed electric potential other than the power source electric potential VDD, for example, the GND (ground).

As described above, in the present embodiment, the pixels in one pixel column adopt the configuration of the longitudinal two pixel sharing. Therefore, the configuration depicted in FIG. 9 is also repetitively provided in the vertical direction (in the column direction). It is only necessary that in each configuration of the longitudinal two pixel sharing, the respective connection wirings of the two pixels are connected to the vertical signal lines different from each other, and can adopt a predetermined arrangement every sharing pixel.

Figure 10:
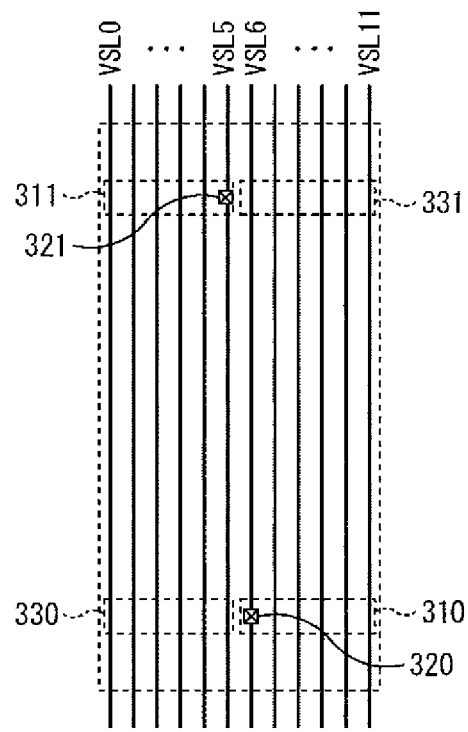
FIG. 10 is a top plan view depicting an example of a layout of vertical signal lines and connection wirings.

For example, as depicted in FIG. 10, the connection wiring 310 may also be formed so as to have the length and arrangement orthogonally intersecting the vertical signal lines VSL6 to VSL11. In addition, the connection wiring 311 may also be formed so as to have the length and arrangement orthogonally intersecting the vertical signal lines VSL0 to VSL5. In the example of FIG. 10, the connection wirings 310 and 311 are connected to the vertical signal lines VSL6 and VSL5 through the vias 320 and 321, individually.

Figure 11:
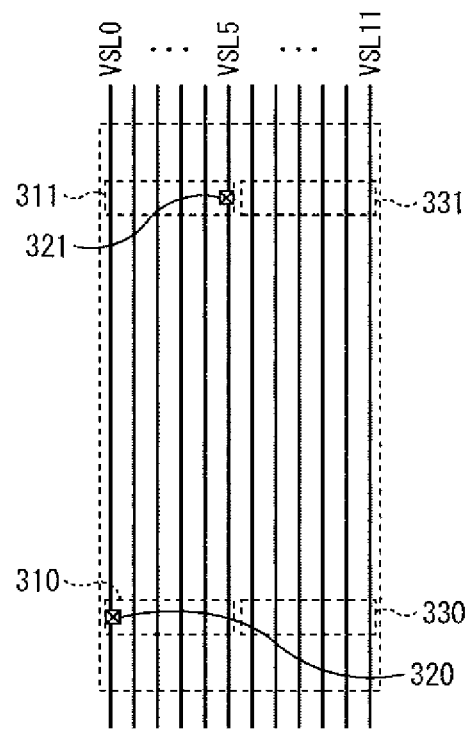
FIG. 11 is a top plan view depicting an example of a layout of vertical signal lines and connection wirings.

In addition, as depicted in FIG. 11, the connection wiring 310 may be formed so as to have the length and arrangement orthogonally intersecting the vertical signal lines VSL0 to VSL5. In addition, the connection wiring 311 may also be formed so as to have the length and arrangement orthogonally intersecting the vertical signal lines VSL0 to VSL5. In the example of FIG. 11, the connection wirings 310 and 311 are connected to the vertical signal lines VSL0 and VSL5 through the vias 320 and 321, individually.

Figure 12:
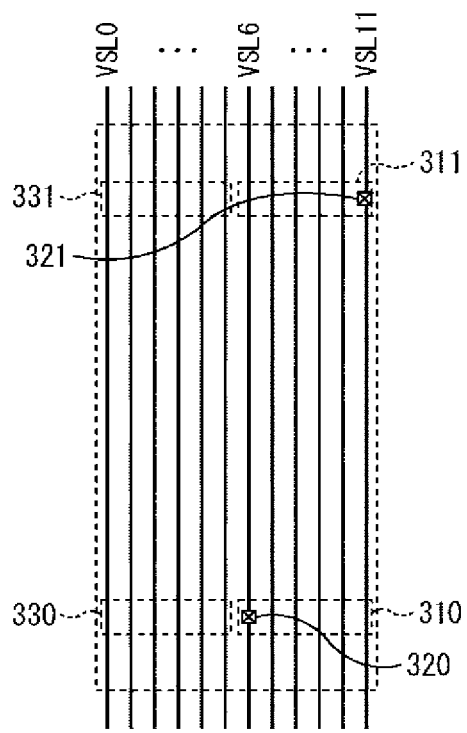
FIG. 12 is a top plan view depicting an example of a layout of vertical signal lines and connection wirings.

Moreover, as depicted in FIG. 12, the connection wiring 310 may be formed so as to have the length and arrangement orthogonally intersecting the vertical signal lines VSL6 to VSL11. In addition, the connection wiring 311 may also be formed so as to have the length and arrangement orthogonally intersecting the vertical signal lines VSL6 to VSL11. In the example of FIG. 12, the connection wirings 310 and 311 are connected to the vertical signal lines VSL6 and VSL11 through the vias 320 and 321, individually.

In such a way, in the configuration of the longitudinal two pixel sharing, the four kinds of arrangement patterns depicted in FIGS. 9 to 12 can be adopted as the arrangement pattern of the connection wirings 310 and 311. As a result, in the solid-state image pickup device adopting the configuration of the longitudinal two pixel sharing, it is possible to realize the various readout modes of the pixels.

3. Second Embodiment

Figure 13:
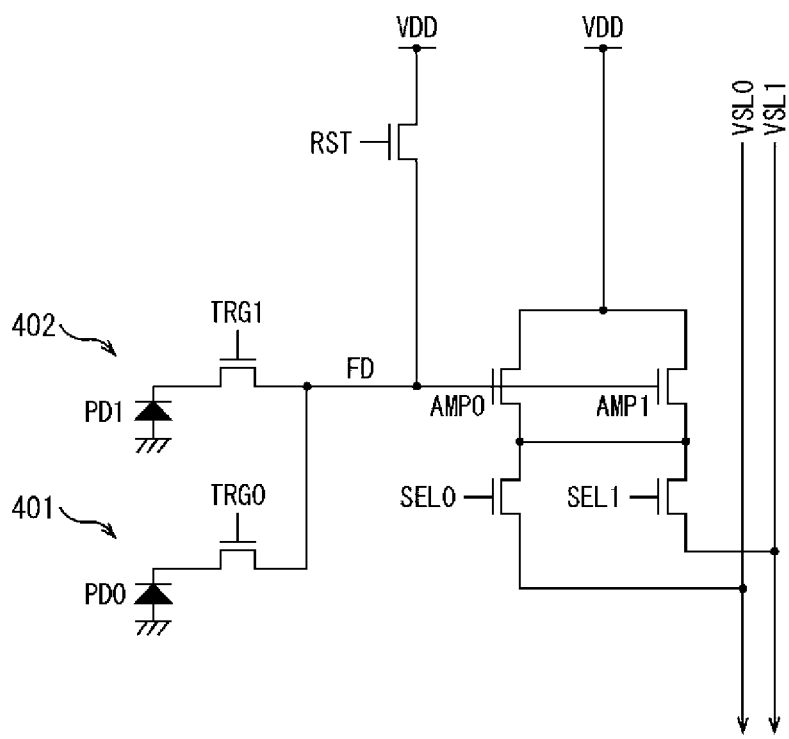
FIG. 13 is a circuit diagram depicting an example of a configuration of a pixel and vertical signal lines of a second embodiment.

FIG. 13 is a circuit diagram depicting an example of a configuration of pixels and vertical signal lines of a second embodiment.

The present embodiment adopts the configuration of the longitudinal two pixels sharing in which two pixels 401 and 402 longitudinally arranged side by side in one pixel column hold one FD in common. In an example of FIG. 13, a basic configuration is similarly to that of the example of FIG. 7. It should be noted that, in the present embodiment, two vertical signal lines VSL0 and VSL1 are provided per one pixel column.

Figure 14:
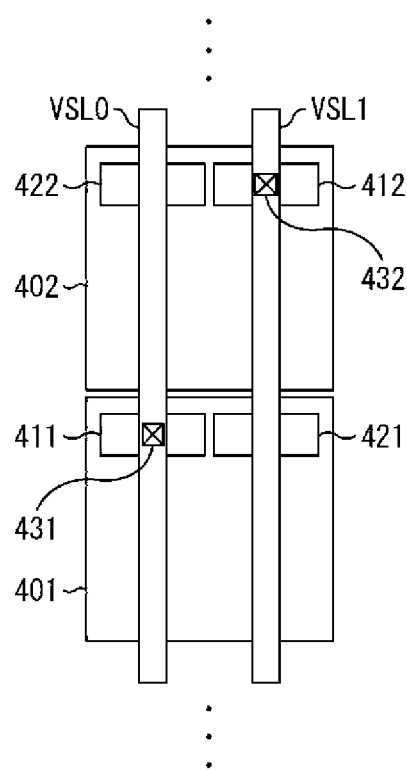
FIG. 14 is a top plan view depicting an example of a layout of vertical signal lines and connection wirings.

FIG. 14 is a top plan view depicting an example of a layout of the vertical signal lines and the connection wirings.

A connection wiring 411 and a shielding wiring 421 are provided in a pixel area of the pixel 401. The connection wiring 411 is connected to a selection transistor which outputs a pixel signal. The shielding wiring 421 holds a predetermined fixed electric potential.

A connection wiring 412 and a shielding wiring 422 are provided in a pixel area of the pixel 402. The connection wiring 412 is connected to a selection transistor which outputs a pixel signal. The shielding wiring 422 holds a predetermined fixed electric potential.

In the example as well of FIG. 14, the connection wiring and the shielding wiring are provided every pixel, and are formed in such a way that the entire lengths thereof are lengths orthogonally intersecting all the vertical signal lines VSL0 and VSL1, and become the same length every pixel. That is to say, in FIG. 14, the entire lengths of the connection wiring 411 and the shielding wiring 421 are set the same as the entire lengths of the connection wiring 412 and the shielding wiring 422.

However, in the example of FIG. 14, the connection wirings and the shielding wirings have the arrangements which are different periodically on the same line with two pixels holding the pixel in common as a repeating unit. Specifically, in the pixel area of the pixel 401, the connection wiring 411 is arranged on the left-hand side on the same line on which the connection wiring 411 and the shielding wiring 421 are each provided. In addition, in the pixel area of the pixel 402, the connection wiring 412 is arranged on the right-hand side on the same line on which the connection wiring 412 and the shielding wiring 422 are each provided.

In the present embodiment, the pixels are arranged in such a way that the configuration of the pixels 401 and 402 is repeated in one pixel column.

In addition, in the example of FIG. 14, the vertical signal line VSL0 is connected to the connection wiring 411 through the via 431, and the vertical signal line VSL1 is connected to the connection wiring 412 through the via 432. That is to say, in the present embodiment, the respective connection wirings of the two pixels constituting the repeating unit in one pixel column are connected to the vertical signal lines different from each other.

It should be noted that in the example of FIG. 14, the readout from the pixels shall be carried out in every other row, that is, shall be carried out every pixel, corresponding to the pixel 401, of the two pixels constituting the repeating unit in one pixel column, and thus shall be carried out every pixel corresponding to the pixel 402.

According to such a configuration, it is possible to suppress the parasitic capacity between the vertical signal lines VSL0 and VSL1, and the connection wirings 411 and 412 in the layer therebelow, and thus it becomes possible to promote the high-frame rate.

In addition, the provision of the shielding wiring enables the coupling of the vertical signal line and other wirings to be prevented (or reduced), and enables the effect of suppression of the noises to be enhanced.

Moreover, the entire lengths of the connection wiring and the shielding wiring which are provided every pixel are made the same length every pixel, thereby resulting in that it is possible to hold the optical symmetry and the electric symmetry, and it is possible to uniformize the optical characteristics and the electric characteristics of the vertical signal lines.

4. Third Embodiment

FIG. 15 is a circuit diagram depicting an example of a configuration of pixels and vertical signal lines of a third embodiment.

The present embodiment adopts the configuration of the longitudinal two pixels sharing in which of four pixels longitudinally arranged side by side in one pixel column, two pixels 501 and 502 hold one FD in common, and two pixels 503 and 504 hold one FD in common. In the example of FIG. 15, a basic configuration of the pixels 501 and 502 is similarly to that of the pixels 401 and 402 in the example of FIG. 13. In addition, a basic configuration of the pixels 503 and 504 is similarly to that of the pixels 501 and 502 except that numerical numbers added to the names of the respective transistors are different therefrom. It should be noted that in the present embodiment, four vertical signal lines VSL0 to VSL3 are provided per one pixel column.

Figure 16:
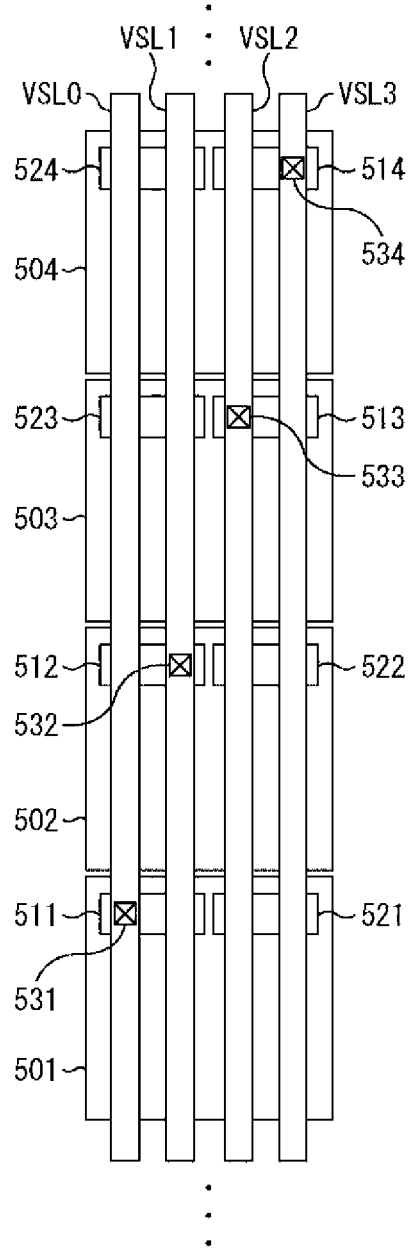
FIG. 16 is a top plan view depicting an example of a layout of vertical signal lines and connection wirings.

FIG. 16 is a top plan view depicting an example of a layout of vertical signal lines and connection wirings.

A connection wiring 511 and a shielding wiring 521 are provided in a pixel area of the pixel 501. The connection wiring 511 is connected to a selection transistor which outputs a pixel signal. The shielding wiring 521 holds a predetermined fixed electric potential.

A connection wiring 512 and a shielding wiring 522 are provided in a pixel area of the pixel 502. The connection wiring 512 is connected to a selection transistor which outputs a pixel signal. The shielding wiring 522 holds a predetermined fixed electric potential.

A connection wiring 513 and a shielding wiring 523 are provided in a pixel area of the pixel 503. The connection wiring 513 is connected to a selection transistor which outputs a pixel signal. The shielding wiring 523 holds a predetermined fixed electric potential.

A connection wiring 514 and a shielding wiring 524 are provided in a pixel area of the pixel 504. The connection wiring 514 is connected to a selection transistor which outputs a pixel signal. The shielding wiring 524 holds a predetermined fixed electric potential.

In the example as well of FIG. 16, the connection wiring and the shielding wiring are provided every pixel, and are formed in such a way that the entire lengths thereof are lengths orthogonally intersecting all the vertical signal lines VSL0 to VSL3, and become the same length every pixel. That is to say, in FIG. 16, the entire lengths of the connection wiring 511 and the shielding wiring 521, the entire lengths of the connection wiring 512 and the shielding wiring 522, the entire lengths of the connection wiring 513 and the shielding wiring 523, and the entire lengths of the connection wiring 514 and the shielding wiring 524 are set equal to one another.

Moreover, in the example of FIG. 16, the connection wirings and the shielding wirings have the arrangements which are different periodically on the same line with four pixels 501 to 504 as a repeating unit. Specifically, in the pixel area of the pixel 501, the connection wiring 511 is arranged on the left-hand side on the same line on which the connection wiring 511 and the shielding wiring 521 are individually provided. In the pixel area of the pixel 502, the connection wiring 512 is arranged on the left-hand side on the same line on which the connection wiring 512 and the shielding wiring 522 are individually provided. In addition, in the pixel area of the pixel 503, the connection wiring 513 is arranged on the right-hand side on the same line on which the connection wiring 513 and the shielding wiring 523 are individually provided. In the pixel area of the pixel 504, the connection wiring 514 is arranged on the right-hand side on the same line on which the connection wiring 514 and the shielding wiring 524 are individually provided.

In the present embodiment, the pixels are arranged in such a way that the configuration of the pixels 501 to 504 is repeated in one pixel column.

In addition, in the example of FIG. 16, the vertical signal line VSL0 is connected to the connection wiring 511 through the via 531, and the vertical signal line VSL1 is connected to the connection wiring 512 through the via 532. In addition, the vertical signal line VSL2 is connected to the connection wiring 513 through the via 533, and the vertical signal line VSL3 is connected to the connection wiring 514 through the via 534. That is to say, in the present embodiment, the respective connection wirings of the four pixels constituting the repeating unit in one pixel column are connected to the vertical signal lines different from one another.

It should be noted that in the example of FIG. 16, the readout from the pixels shall be carried out in every other row, that is, shall be carried out every pixel corresponding to the pixels 501 and 503 of the four pixels constituting the repeating unit in one pixel column, and thus shall be carried out every pixel corresponding to the pixels 502 and 504.

According to such a configuration, it is possible to suppress the parasitic capacity between the vertical signal lines VSL0 to VSL3, and the connection wirings 511 to 514 in the layer therebelow, and thus it becomes possible to promote the high-frame rate.

In addition, the provision of the shielding wirings enables the coupling of the vertical signal line and other wirings to be prevented (or reduced), and enables the effect of suppression of the noises to be enhanced.

Moreover, the entire lengths of the connection wiring and the shielding wiring which are provided every pixel are made the same length every pixel, thereby resulting in that it is possible to hold the optical symmetry and the electric symmetry, and it is possible to uniformize the optical characteristics and the electric characteristics of the vertical signal lines.

5. Fourth Embodiment

Next, a description will be given with respect to a configuration of pixels and vertical signal lines of a fourth embodiment.

Since a circuit configuration of the present embodiment is similarly to that of the example of FIG. 15, a detailed description is omitted. That is to say, the present embodiment adopts the configuration of the longitudinal two pixel sharing in which of the four pixels which are longitudinally arranged side by side in the pixel column, two pixels 601 and 602 (FIG. 17) hold one FD in common, and two pixels 603 and 604 (FIG. 17) hold one FD in common. It should be noted that in the present embodiment as well, four vertical signal lines VSL0 to VSL3 are provided per one pixel column.

Figure 17:
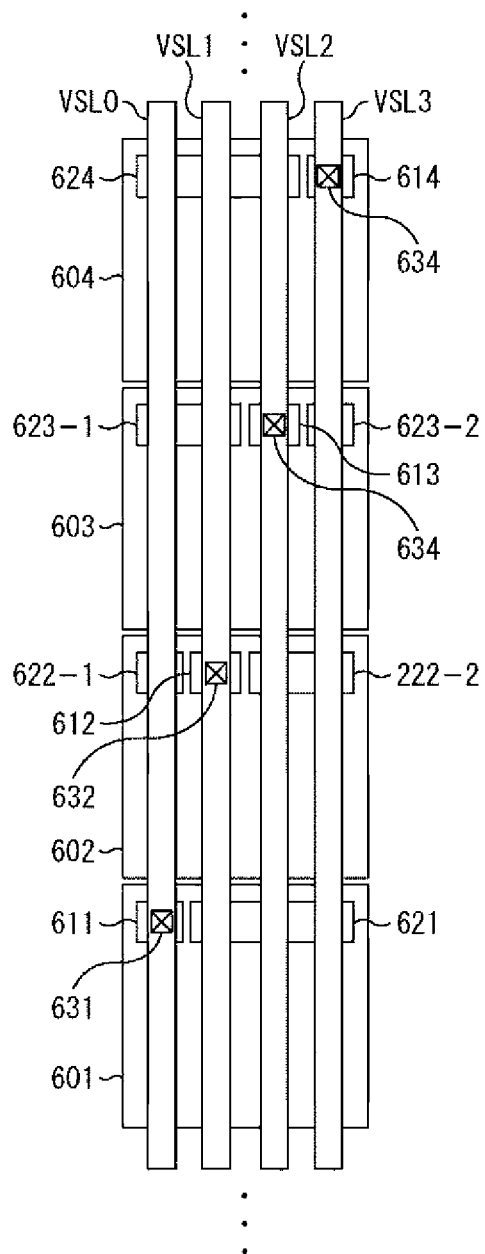
FIG. 17 is a top plan view depicting an example of a layout of vertical signal lines and connection wirings of a fourth embodiment.

FIG. 17 is a top plan view depicting an example of a layout of vertical signal lines and connection wirings.

A connection wiring 611 and a shielding wiring 621 are provided in a pixel area of the pixel 601. The connection wiring 611 is connected to a selection transistor which outputs a pixel signal. The shielding wiring 621 holds a predetermined fixed electric potential.

A connection wiring 612, and shielding wirings 622-1 and 622-2 are provided in a pixel area of the pixel 602. The connection wiring 612 is connected to a selection transistor which outputs a pixel signal. The shielding wirings 622-1 and 622-2 hold predetermined fixed electric potentials.

A connection wiring 613, and shielding wirings 623-1 and 623-2 are provided in a pixel area of the pixel 603. The connection wiring 613 is connected to a selection transistor which outputs a pixel signal. The shielding wirings 623-1 and 623-2 hold predetermined fixed electric potentials.

A connection wiring 614 and shielding wiring 624 are provided in a pixel area of the pixel 604. The connection wiring 614 is connected to a selection transistor which outputs a pixel signal. The shielding wiring 624 holds a predetermined fixed electric potential.

In the example as well of FIG. 17, the connection wirings and the shielding wirings are provided every pixel, and are formed in such a way that the entire lengths thereof are lengths orthogonally intersecting all the vertical signal lines VSL0 to VSL3, and become the same length every pixel. That is to say, in FIG. 17, the entire lengths of the connection wiring 611 and the shielding wiring 621, the entire lengths of the connection wiring 612 and the shielding wirings 622-1 and 622-2, the entire lengths of the connection wiring 613 and the shielding wirings 623-1 and 623-2, and the entire lengths of the connection wiring 614 and the shielding wiring 624 are made the same length.

Moreover, in the example of FIG. 17, the connection wirings and the shielding wirings adopt the arrangements which are different periodically on the same line with four pixels 601 to 604 as the repeating unit. Specifically, in the pixel area of the pixel 601, the connection wiring 611 is arranged on the left-hand side end (the position where it intersects the vertical signal line VSL0) on the same line on which the connection wiring 611 and the shielding wiring 621 are provided. In the pixel area of the pixel 602, the connection wiring 612 is arranged on the left-hand side of the middle (the position where it intersects the vertical signal line VSL1) on the same line on which the connection wiring 612 and the shielding wirings 622-1 and 622-2 are provided. In addition, in the pixel area of the pixel 603, the connection wiring 613 is arranged on the right-hand side of the middle (the position where it intersects the vertical signal line VSL2) on the same line on which the connection wiring 613 and the shielding wirings 623-1 and 623-2 are provided. In the pixel area of the pixel 604, the connection wiring 614 is arranged on the right-hand side end (the position where it intersects the vertical signal line VSL3) on the same line on which the connection wiring 614 and the shielding wiring 624 are provided.

In the present embodiment, the pixels are arranged in such a way that in one pixel column, the configuration of the pixels 601 to 604 is repeated.

In addition, in the example of FIG. 17, the vertical signal line VSL0 is connected to the connection wiring 611 through the via 631 and the vertical signal line VSL1 is connected to the connection wiring 612 through the via 632. In addition, the vertical signal line VSL2 is connected to the connection wiring 613 through the via 633 and the vertical signal line VSL3 is connected to the connection wiring 614 through the via 634. That is to say, in the present embodiment, the respective connection wirings of the four pixels constituting the repeating unit in one pixel column are connected to the vertical signal lines different from one another.

It should be noted that in the example of FIG. 17, the readout from the pixels shall be carried out in every other row, that is, shall be carried out every pixel corresponding to the pixels 601 and 603 of the four pixels constituting the repeating unit in one pixel column, and shall be carried out every pixel corresponding to the pixels 602 and 604 of the four pixels constituting the repeating unit in one pixel column. Similar to FIG. 8, the shielding wirings of FIG. 17 may be referred to as dummy electrodes or dummy wirings. For example, the dummy electrode 623 may be referred to as including a plurality of dummy electrode portions (e.g., 623-1, 623-2). As shown, the plurality of dummy electrode portions 23-1, 623-2 have different sizes.

According to such a configuration, it is possible to further suppress the parasitic capacity between the vertical signal lines VSL0 to VSL3, and the connection wirings 611 to 614 in the layer therebelow, and thus it becomes possible to enhance the higher-frame rate.

In addition, the provision of the shielding wiring enables the coupling of the vertical signal line and other wirings to be prevented (or reduced), and enables the effect of suppression of the noises to be enhanced.

Moreover, the entire lengths of the connection wirings and the shielding wirings which are provided every pixel are made the same length every pixel, thereby resulting in that it is possible to hold the optical symmetry and the electric symmetry, and it is possible to uniformize the optical characteristics and the electric characteristics of the vertical signal lines.

6. Fifth Embodiment

FIG. 18 is a circuit diagram depicting an example of a configuration of pixels and vertical signal lines of a fifth embodiment.

The present embodiment adopts a configuration of four pixel sharing in which four pixels 701 to 704 of 2 in length×2 in width which are arranged so as to straddle two pixel column hold one FD in common. In the example of FIG. 18, the configuration other than the PD and the transfer transistor of each pixel is similarly to that of the example of FIG. 7. It should be noted that in the present embodiment, 12 vertical signal lines VSL0 to VSL11 are provided per two pixel columns, that is, six vertical signal lines are provided per one pixel column.

Figure 19:
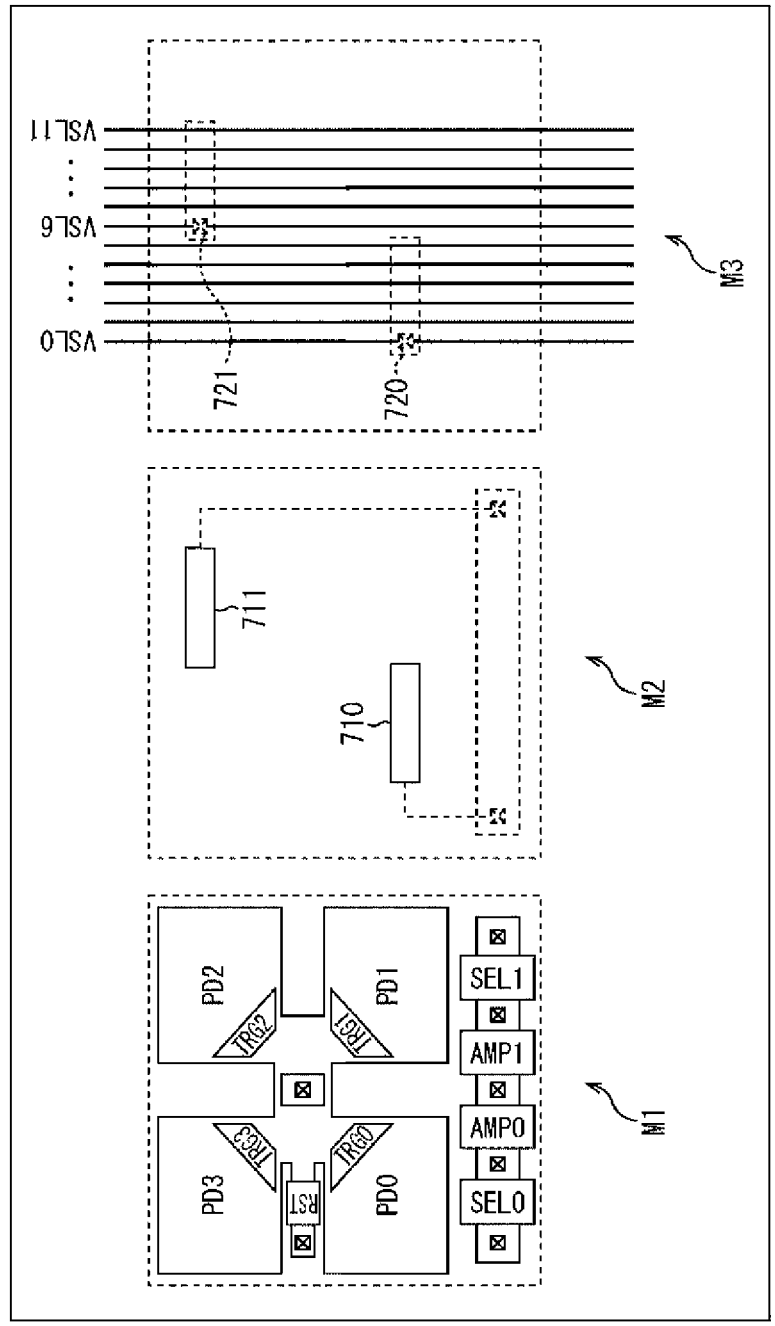
FIG. 19 is a top plan view depicting a layout of each of metal layers.

FIG. 19 is a top plan view depicting an example of a layout of each of metal layers in portions of pixels 701 to 704.

As depicted in FIG. 19, the portions of the pixels 701 to 704 are constituted by metal layers M1 to M3 of three layers.

PD0 to PD3 and respective transistors, including transfer transistors TRG0 to TRG3 are formed in the metal layer M1.

A connection wiring 710 and a connection wiring 711 are formed in the metal layer M2 provided in the upper layer of the metal layer M1. The connection wiring 710 is connected to a selection transistor SEL0 which outputs a pixel signal. The connection wiring 711 is connected to a selection transistor SEL1 which outputs a pixel signal.

12 vertical signal lines VSL0 to VSL11 are formed in the metal layer M3 provided in the upper layer of the metal layer M2. Of them, the vertical signal line VSL0 is connected to the connection wiring 710 of the metal layer M2 through a via 720, and the vertical signal line VSL6 is connected to the connection wiring 711 of the metal layer M2 through a via 721.

That is to say, pixel signals from the pixels 701 to 704 are either output to the vertical signal line VSL0 through the connection wiring 710 and the via 720, or output to the vertical signal line VSL6 through the connection wiring 711 and the via 721.

In addition, the connection wiring 710 is formed in such a way that a length thereof becomes a length orthogonally intersecting the vertical signal lines VSL0 to VSL5, and the connection wiring 711 is formed in such a way that a length thereof becomes a length orthogonally intersecting the vertical signal lines VSL6 to VSL11.

It should be noted that since in the present embodiment, the pixels in two pixel column adopt the four pixel sharing, the configuration depicted in FIG. 19 is repetitively provided in the vertical direction (in the column direction). It is only necessary that in the respective configurations of the four pixel sharing, the respective connection wirings of the pixel column are connected to the vertical signal lines different from one another. In the example of FIG. 19, the respective connection wirings 710 and 711 are individually connected to the vertical signal lines VSL0 and VSL6. However, other respective connection wirings of the pixel rows in the configuration of the four pixel sharing either may be individually connected to the vertical signal lines VSL1 and VSL7, or may also be individually connected to the vertical signal lines VSL5 and VSL11.

According to such a configuration, as compared with the configuration of FIG. 9, since the number of vertical signal lines per one pixel column can be halved, the interval and wiring width of the vertical signal lines can be widened. As a result, since the parasitic capacity between the vertical signal lines can be reduced and the wiring resistance of the vertical signal line itself can be reduced, the time constant determined depending on RC can be suppressed to small one, and thus the high-frame rate can be promoted.

It should be noted that in the example of FIG. 19, the shielding wiring extending on the same line as that of the connection wiring 710 may also be formed on the right-hand side in the figure of the connection wiring 710, and the shielding wiring extending on the same line as that of the connection wiring 711 may also be formed on the left-hand side in the figure of the connection wiring 711.

In this case, the connection wiring and the shielding wiring are provided every pixel row, and are formed in such a way that the entire lengths thereof are lengths orthogonally intersecting all the vertical signal lines VSL0 to VSL11, and become the same length every pixel row.

As a result, it is possible to prevent (or reduce) the coupling of the vertical signal line and other wirings, and it is possible to enhance the effect of suppression of the noises. In addition thereto, it is possible to hold the optical symmetry and the electric symmetry, and it is possible to uniformize the optical characteristics and the electric characteristics of the vertical signal lines.

It should be noted that although in the example of FIG. 19, 12 vertical signal lines are provided every two pixel columns, 24 vertical signal lines may also be provided every two pixel columns, or the other number of vertical signal lines may also be provided every two pixel columns.

The solid-state image pickup device as described above can be applied to various electronic apparatuses such as an image pickup system such as a digital still camera, or a digital video camera, a mobile phone including an image pickup function, or other apparatuses each including an image pickup function, for example.

7. Example of Configuration of Electronic Apparatus

Figure 20:
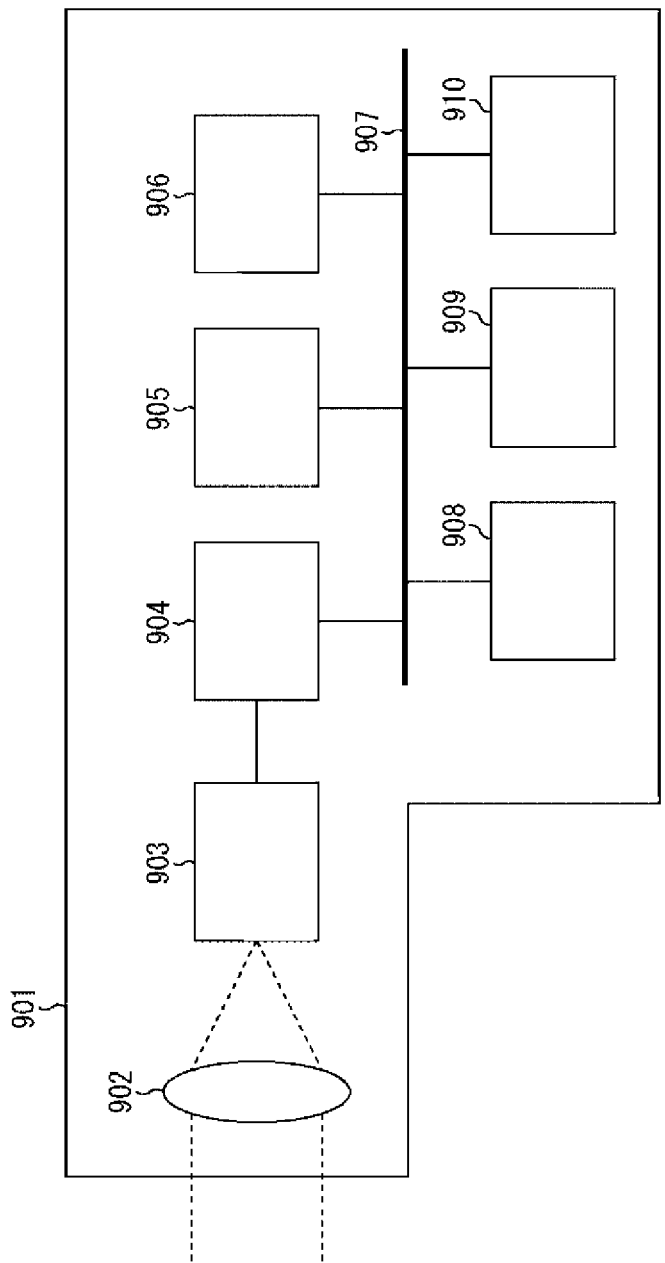
FIG. 20 is a block diagram depicting an example of a configuration of an electronic apparatus to which the present technique is applied.

FIG. 20 is a block diagram depicting an example of a configuration of an image pickup apparatus as an electronic apparatus to which the present technique is applied.

As depicted in FIG. 20, an image pickup apparatus 901 is provided with an optical system 902, a solid-state image pickup device 903, and a DSP (Digital Signal Processor) 904. The DSP 904, a display device 905, an operation system 906, a memory 908, a recorder 909, and a power source system 910 are connected to one another through a bus 907, and a still image and a moving image can be captured.

The optical system 902 is structured so as to have one sheet of or a plurality of sheets of lenses, and guides image light (incident light) from a subject to the solid-state image pickup device 903 to image the image light on a light receiving surface (sensor portion) of the solid-state image pickup device 903.

The solid-state image pickup device having the pixels of any of the embodiments described above is applied as the solid-state image pickup device 903. The electrons are accumulated in the solid-state image pickup device 903 for a given period of time in response to the image formed on the light receiving surface through the optical system 902. Then, a signal corresponding to the electrons accumulated in the solid-state image pickup device 903 is supplied to the DSP 904.

The DSP 904 executes various signal processing for the signal from the solid-state image pickup device 903 to acquire the image, and causes the memory 908 to temporarily store therein the data on the image. The data on the image stored in the memory 908 is recorded in the recorder 909 or is supplied to the display device 905 to be displayed thereon. In addition, the operation system 906 receives various operations by a user to supply an operation signal to the respective blocks of the image pickup apparatus 901. The power source system 910 supplies an electric power necessary for the drive for the blocks of the image pickup apparatus 901.

In the image pickup apparatus 901 configured in such a way, the solid-state image pickup device as described above is applied as the solid-state image pickup device 903, thereby enabling the high-frame rate to be promoted. Therefore, it becomes possible to capture the finer image.

In addition, the configuration of the solid-state image pickup device in the present technique can be adopted in a surface illumination type CMOS image sensor as well as a backside illumination type CMOS image sensor.

8. Examples of Use of Image Sensor

Next, a description will be given with respect to examples of use of an image sensor to which the present technique is applied.

FIG. 21 is a view depicting examples of use of the image sensor to which the present technique is applied.

The image sensor described above, for example, as will be described below, can be used in such various cases as to sense the light such as visible light, infrared radiation, ultraviolet rays, and X-rays.

An apparatus, for photographing an image for use in appreciation, such as a digital camera or a portable apparatus with a camera function An apparatus, for use in traffic, such as an on-board sensor for photographing, a front side, a rear side, a periphery, a car interior for safe driving such as automatic stop, recognition or the like of a state of a driver or the like, a monitoring camera for monitoring a road for a travelling vehicle, or a distance measuring sensor for measuring a distance between vehicles An apparatus, for use in a consumer electronics, such as a TV, a refrigerator, or an air conditioner, for imaging a gesture of a user to carry out an apparatus operation responding to the gesture An apparatus, for use in medical care or health care, such as an endoscope, or an apparatus for photographing a blood vessel by receiving infrared rays An apparatus, for use in security, such as a monitoring camera for security applications, or a camera for person authentication applications An apparatus, for use in beauty, such as a skin measuring instrument for photographing a skin, or a microscope for photographing a scalp An apparatus, for sport, such as an action camera or a wearable camera for sport applications An apparatus, for use in agriculture, such as a camera for monitoring a state of a field or crops It should be noted that the embodiments of the present technique are by no means limited to the embodiments described above, and various changes can be made without departing from the subject matter of the present technique.

Furthermore, the present technique can adopt the following constitutions.

(1)

A solid-state image pickup device including:

a pixel array in which pixels are arranged in matrix;

a plurality of vertical signal lines provided in units of a pixel column; and a connection wiring provided every an output transistor outputting a pixel signal in the pixel, and orthogonally intersecting at least any one of the vertical signal lines, in which the connection wiring is connected to the output transistor, and any one of the vertical signal lines.

(2)

The solid-state image pickup device described in (1), in which the vertical signal lines, the connection wiring, and the output transistor are individually formed in different metal layers, and the vertical signal line and the connection wiring are connected to each other through a via.

(3)

The solid-state image pickup device described in (1) or (2), in which the connection wiring is provided every pixel, and lengths of the connection wirings are lengths orthogonally intersecting all the vertical signal lines provided every pixel column, and are the same length every pixel.

(4)

The solid-state image pickup device described in (1) or (2), in which the connection wiring is provided every pixel, the solid-state image pickup device further includes a shielding wiring extending on the same line as that of the connection wiring, and holds a predetermined fixed electric potential, and entire lengths of the connection wiring and the shielding wiring are lengths orthogonally intersecting all the vertical signal lines provided every pixel column, and are the same length every pixel.

(5)

The solid-state image pickup device described in (4), in which the connection wirings have a predetermined arrangement on the same line every the predetermined number of pixels constituting the pixel column.

(6)

The solid-state image pickup device described in (5), in which the connection wirings have arrangements which are different periodically on the same line with the predetermined number of pixels as a repeating unit.

(7)

The solid-state image pickup device described in (6), in which the respective connection wirings of the pixels constituting the repeating unit are connected to the vertical signal lines different from one another.

(8)

The solid-state image pickup device described in (6) or (7),
- in which the pixels the number of which is equal to or smaller than the number of pixels constituting the repeating unit hold one FD (Floating Diffusion) in common.

(9)

The solid-state image pickup device described in (8),
- in which the pixels of one pixel column adopt a configuration of longitudinal two pixel sharing.

(10)

The solid-state image pickup device described in (2),
- in which the pixels of m in length×n in width hold one Floating Diffusion (DF) in common,
- the connection wiring is provided every pixel row of the pixels holding the FD in common, and
- a length of the connection wiring is a length orthogonally intersecting the predetermined number of vertical signal lines of the vertical signal lines provided every n pixel column.

(11)

An electronic apparatus having a solid-state image pickup device, including:
- a pixel array in which pixels are arranged in matrix;
- a plurality of vertical signal lines provided in units of a pixel column; and
- a connection wiring provided every an output transistor outputting a pixel signal in the pixel, and orthogonally intersecting at least any one of the vertical signal lines, in which the connection wiring is connected to the output transistor, and any one of the vertical signal lines.

(12)

An imaging device, comprising:
- a pixel array including a plurality of pixel units in a matrix arrangement, at least a first pixel unit of the plurality of pixel units including:
  - a substrate including a first photoelectric conversion region and a second photoelectric conversion region;
  - a first layer over the substrate and including a first pixel circuit coupled to the first photoelectric conversion region and a second pixel circuit coupled to the second photoelectric conversion region, the first pixel circuit having one or more first transfer elements to output a first pixel signal, the second pixel circuit having one or more second transfer elements to output a second pixel signal;
  - a second layer over the first layer and including first and second wirings extending in a first direction, the first wiring being spaced apart from the second wiring in a second direction that is perpendicular to the first direction, the first wiring being coupled to the one or more first transfer elements, the second wiring being coupled to the one or more second transfer elements; and
  - a third layer over the second layer and including signal lines that extend in the second direction;
  - a first via that couples a first signal line of the signal lines to the first wiring; and
  - a second via offset from the first via in the first direction and that couples a second signal line of the signal lines to the second wiring.

(13)

The imaging device of (12), wherein, in a plan view, the first wiring overlaps at least a portion of the first pixel circuit, and the second wiring overlaps at least a portion of the second pixel circuit.

(14)

The imaging device of (13), wherein, in the plan view, the first wiring overlaps the first photoelectric conversion region, and the second wiring overlaps the second photoelectric conversion region.

(15)

The imaging device of (12), wherein, in a plan view, the first and second wirings overlap the signal lines.

(16)

The imaging device of (12), wherein the second layer further comprises:
- a first dummy electrode adjacent to the first wiring;
- a second dummy electrode adjacent to the second wiring, wherein the first and second dummy wirings extend in the first direction.

(17)

The imaging device of (16), wherein the first and second dummy electrodes are coupled to nodes configured to receive a fixed potential.

(18)

The imaging device of (17), wherein the fixed potential is a ground potential.

(19)

The imaging device of (16), wherein the first dummy electrode is aligned with the first wiring in the first direction, and the second dummy electrode is aligned with the second wiring in the first direction.

(20)

The imaging device of (16), wherein the first dummy electrode comprises a plurality of first dummy electrode portions, and the second dummy electrode comprises a plurality of second dummy electrode portions.

(21)

The imaging device of (20), wherein the plurality of first dummy electrode portions have different sizes, and the plurality of second dummy electrode portions have different sizes.

(22)

The imaging device of (12), wherein, in a plan view, other ones of the signal lines are between the first signal line and the second signal line in the first direction.

(23)

The imaging device of (12), wherein, in a plan view, no other ones of the signal lines are between the first second line and the second signal line.

(24)

The imaging device of (12), wherein, in a plan view, the first wiring and the second wiring are offset from one another in the first direction.

(25)

The imaging device of (12), wherein the one or more first transfer elements and the one or more second transfer elements include at least one of a transfer transistor, a reset transistor, an amplification transistor, and a selection transistor.

(26)

An imaging device, comprising:
- a pixel array including a plurality of pixel units in a matrix arrangement, a pixel unit of the plurality of pixel units including:
  - a substrate including a plurality of photoelectric conversion regions, the plurality of photoelectric conversion regions sharing a floating diffusion;
  - a first layer over the substrate and including a pixel circuit coupled to the plurality of photoelectric conversion regions, the pixel circuit having one or more transfer elements to output a pixel signal;

a second layer over the first layer and including first and second wirings extending in a first direction, the first wiring being offset from the second wiring in the first direction, the first wiring being spaced apart from the second wiring in a second direction that is perpendicular to the first direction, the first and second wirings being coupled to the pone or more transfer elements; and
a third layer over the second layer and including signal lines that extend in the second direction;
a first via that couples a first signal line of the signal lines to the first wiring; and
a second via offset from the first via in the first direction and that couples a second signal line of the signal lines to the second wiring.

(27)
The imaging device of (26), wherein, in a plan view, other ones of the signal lines are between the first signal line and the second signal line in the first direction.

(28)
The imaging device of (26), wherein the plurality of photoelectric conversion regions includes four photoelectric conversion regions.

(29)
The imaging device of (26), wherein the one or more transfer elements includes: at least one first transfer element to output the pixel signal to the first wiring; and at least one second transfer element to output the pixel signal to the second wiring.

(30)
The imaging device of (26), wherein, in a plan view, each of the first wiring and the second wiring overlap fewer than all of the signal lines.

(31)
An electronic apparatus, comprising:
an imaging device including:
a pixel array including a plurality of pixel units in a matrix arrangement, a first pixel unit of the plurality of pixel units including:
a substrate including a first photoelectric conversion region and a second photoelectric conversion region;
a first layer over the substrate and including a first pixel circuit coupled to the first photoelectric conversion region and a second pixel circuit coupled to the second photoelectric conversion region, the first pixel circuit having one or more first transfer elements to output a first pixel signal, the second pixel circuit having one or more second transfer elements to output a second pixel signal;
a second layer over the first layer and including first and second wirings extending in a first direction, the first wiring being spaced apart from the second wiring in a second direction that is perpendicular to the first direction, the first wiring being coupled to the one or more first transfer elements, the second wiring being coupled to the one or more second transfer elements; and
a third layer over the second layer and including signal lines that extend in the second direction;
a first via that couples a first signal line of the signal lines to the first wiring; and
a second via offset from the first via in the first direction and that couples a second signal line of the signal lines to the second wiring.

REFERENCE SIGNS LIST 1, 10, 20 Solid-state image pickup device
2 Pixel array
6, 6-0, 6-1 Pixel
8 Vertical signal line
310, 311 Connection wiring
320, 321 Via
330, 331 Shielding wiring
SEL0, SEL1 Selection transistor
901 Electronic apparatus
903 Solid-state image pickup device

What is claimed is:
1. An imaging device, comprising:
a pixel array including a plurality of pixel units in a matrix arrangement, at least a first pixel unit of the plurality of pixel units including:
a substrate including a first photoelectric conversion region and a second photoelectric conversion region;
a first layer over the substrate and including a first pixel circuit coupled to the first photoelectric conversion region and a second pixel circuit coupled to the second photoelectric conversion region, the first pixel circuit having one or more first transfer elements to output a first pixel signal, the second pixel circuit having one or more second transfer elements to output a second pixel signal;
a second layer over the first layer and including first and second wirings extending in a first direction, the first wiring being spaced apart from the second wiring in a second direction that is perpendicular to the first direction, the first wiring being coupled to the one or more first transfer elements, the second wiring being coupled to the one or more second transfer elements;
a third layer over the second layer and including signal lines that extend in the second direction;
a first via that couples a first signal line of the signal lines to the first wiring; and
a second via offset from the first via in the first direction and that couples a second signal line of the signal lines to the second wiring.

2. The imaging device of claim 1, wherein, in a plan view, the first wiring overlaps at least a portion of the first pixel circuit, and the second wiring overlaps at least a portion of the second pixel circuit.

3. The imaging device of claim 2, wherein, in the plan view, the first wiring overlaps the first photoelectric conversion region, and the second wiring overlaps the second photoelectric conversion region.

4. The imaging device of claim 1, wherein, in a plan view, the first and second wirings overlap the signal lines.

5. The imaging device of claim 1, wherein the second layer further comprises:
a first dummy electrode adjacent to the first wiring;
a second dummy electrode adjacent to the second wiring, wherein the first and second dummy wirings extend in the first direction.

6. The imaging device of claim 5, wherein the first and second dummy electrodes are coupled to nodes configured to receive a fixed potential.

7. The imaging device of claim 6, wherein the fixed potential is a ground potential.

8. The imaging device of claim 5, wherein the first dummy electrode is aligned with the first wiring in the first direction, and the second dummy electrode is aligned with the second wiring in the first direction.

9. The imaging device of claim 5, wherein the first dummy electrode comprises a plurality of first dummy electrode portions, and the second dummy electrode comprises a plurality of second dummy electrode portions.

10. The imaging device of claim 9, wherein the plurality of first dummy electrode portions have different sizes, and the plurality of second dummy electrode portions have different sizes.

11. The imaging device of claim 1, wherein, in a plan view, other ones of the signal lines are between the first signal line and the second signal line in the first direction.

12. The imaging device of claim 1, wherein, in a plan view, no other ones of the signal lines are between the first second line and the second signal line.

13. The imaging device of claim 1, wherein, in a plan view, the first wiring and the second wiring are offset from one another in the first direction.

14. The imaging device of claim 1, wherein the one or more first transfer elements and the one or more second transfer elements include at least one of a transfer transistor, a reset transistor, an amplification transistor, and a selection transistor.

15. An imaging device, comprising:
   a pixel array including a plurality of pixel units in a matrix arrangement, a pixel unit of the plurality of pixel units including:
      a substrate including a plurality of photoelectric conversion regions, the plurality of photoelectric conversion regions sharing a floating diffusion;
      a first layer over the substrate and including a pixel circuit coupled to the plurality of photoelectric conversion regions, the pixel circuit having one or more transfer elements to output a pixel signal;
      a second layer over the first layer and including first and second wirings extending in a first direction, the first wiring being offset from the second wiring in the first direction, the first wiring being spaced apart from the second wiring in a second direction that is perpendicular to the first direction, the first and second wirings being coupled to the one or more transfer elements;
      a third layer over the second layer and including signal lines that extend in the second direction;
      a first via that couples a first signal line of the signal lines to the first wiring; and
      a second via offset from the first via in the first direction and that couples a second signal line of the signal lines to the second wiring.

16. The imaging device of claim 15, wherein, in a plan view, other ones of the signal lines are between the first signal line and the second signal line in the first direction.

17. The imaging device of claim 15, wherein the plurality of photoelectric conversion regions includes four photoelectric conversion regions.

18. The imaging device of claim 15, wherein the one or more transfer elements include:
   at least one first transfer element to output the pixel signal to the first wiring; and
   at least one second transfer element to output the pixel signal to the second wiring.

19. The imaging device of claim 15, wherein, in a plan view, each of the first wiring and the second wiring overlap fewer than all of the signal lines.

20. An electronic apparatus, comprising:
   an imaging device including:
   a pixel array including a plurality of pixel units in a matrix arrangement, a first pixel unit of the plurality of pixel units including:
      a substrate including a first photoelectric conversion region and a second photoelectric conversion region;
      a first layer over the substrate and including a first pixel circuit coupled to the first photoelectric conversion region and a second pixel circuit coupled to the second photoelectric conversion region, the first pixel circuit having one or more first transfer elements to output a first pixel signal, the second pixel circuit having one or more second transfer elements to output a second pixel signal;
      a second layer over the first layer and including first and second wirings extending in a first direction, the first wiring being spaced apart from the second wiring in a second direction that is perpendicular to the first direction, the first wiring being coupled to the one or more first transfer elements, the second wiring being coupled to the one or more second transfer elements;
      a third layer over the second layer and including signal lines that extend in the second direction;
      a first via that couples a first signal line of the signal lines to the first wiring; and
      a second via offset from the first via in the first direction and that couples a second signal line of the signal lines to the second wiring.

* * * * *